United States Patent
Yap et al.

(10) Patent No.: US 7,650,080 B2
(45) Date of Patent: Jan. 19, 2010

(54) METHOD AND APPARATUS FOR WAVEFORM GENERATION

(75) Inventors: Daniel Yap, Newbury Park, CA (US); Keyvan Sayyah, Santa Monica, CA (US)

(73) Assignee: HRL Laboratories, LLC, Malibu, CA (US)

(*) Notice: Subject to any disclaimer, the term of this patent is extended or adjusted under 35 U.S.C. 154(b) by 965 days.

(21) Appl. No.: 10/824,197

(22) Filed: Apr. 13, 2004

(65) Prior Publication Data
US 2004/0264977 A1 Dec. 30, 2004

Related U.S. Application Data

(63) Continuation-in-part of application No. PCT/US02/36849, filed on Nov. 15, 2002, and a continuation-in-part of application No. PCT/US02/36982, filed on Nov. 15, 2002, which is a continuation-in-part of application No. 10/116,829, filed on Apr. 5, 2002.

(60) Provisional application No. 60/332,372, filed on Nov. 15, 2001.

(51) Int. Cl.
H04B 10/04 (2006.01)
H04B 10/00 (2006.01)
(52) U.S. Cl. ............. 398/183; 398/186; 398/161
(58) Field of Classification Search ............. 398/161, 398/182–183, 185–186, 195, 198; 372/25–26, 372/31, 29.01–29.02
See application file for complete search history.

(56) References Cited

U.S. PATENT DOCUMENTS

| | | | |
|---|---|---|---|
| 4,028,702 A | 6/1977 | Levine | 343/100 SA |
| 4,296,319 A | 10/1981 | Franks et al. | 250/227 |
| 5,001,336 A | 3/1991 | De La Chapelle | 250/208.2 |
| 5,153,762 A | 10/1992 | Huber | 359/125 |
| 5,379,309 A | 1/1995 | Logan, Jr. | 372/18 |
| 5,383,198 A | 1/1995 | Pelouch et al. | 372/18 |
| 5,404,006 A | 4/1995 | Schaffner et al. | 250/208.2 |
| 5,428,814 A | 6/1995 | Mort et al. | 455/12.1 |
| 5,504,774 A | 4/1996 | Takai et al. | 375/134 |
| 5,577,057 A | 11/1996 | Frisken | 372/18 |
| 5,617,239 A | 4/1997 | Walker | 359/181 |
| 5,625,729 A | 4/1997 | Brown | 385/31 |
| 5,687,261 A | 11/1997 | Logan | 385/24 |
| 5,710,651 A * | 1/1998 | Logan, Jr. | 398/168 |

(Continued)

FOREIGN PATENT DOCUMENTS

EP 0 352 747 A2 1/1990

(Continued)

OTHER PUBLICATIONS

U.S. Appl. No. 10/696,607, filed Oct. 28, 2003, Yap.

(Continued)

Primary Examiner—Quan-Zhen Wang

(57) ABSTRACT

A spread spectrum waveform generator has a photonic oscillator and an optical heterodyne synthesizer. The photonic oscillator is a multi-tone optical comb generator for generating a series of RF comb lines on an optical carrier. The optical heterodyne synthesizer includes first and second phase-locked lasers, where the first laser feeds the multi-tone optical comb generator and the second laser is a single tone laser whose output light provides a frequency translation reference. At least one photodetector is provided for heterodyning the frequency translation reference with the optical output of the photonic oscillator to generate a spread spectrum waveform. A receiver pre-processor may be provided to operate on the spread spectrum waveform.

64 Claims, 20 Drawing Sheets

U.S. PATENT DOCUMENTS

| | | | |
|---|---|---|---|
| 5,723,856 A | 3/1998 | Yao et al. | 250/227.1 |
| 5,777,778 A | 7/1998 | Yao | 359/245 |
| 5,796,506 A | 8/1998 | Tsai | 359/191 |
| 5,859,611 A | 1/1999 | Lam et al. | 342/368 |
| 5,861,845 A | 1/1999 | Lee et al. | 342/375 |
| 5,917,179 A | 6/1999 | Yao | 250/227.1 |
| 5,917,970 A | 6/1999 | Burns et al. | 385/24 |
| 5,929,430 A | 7/1999 | Yao et al. | 250/205 |
| 5,930,031 A | 7/1999 | Zhou et al. | 359/344 |
| 5,933,113 A | 8/1999 | Newburg et al. | 342/375 |
| 5,999,128 A | 12/1999 | Stephens et al. | 342/375 |
| 6,027,254 A | 2/2000 | Yamada et al. | 385/88 |
| 6,061,369 A | 5/2000 | Conradi | 372/6 |
| 6,178,036 B1 | 1/2001 | Yao | 359/334 |
| 6,188,808 B1 | 2/2001 | Zhou et al. | 385/3 |
| 6,195,187 B1 | 2/2001 | Soref et al. | 398/9 |
| 6,201,638 B1 * | 3/2001 | Hall et al. | 359/346 |
| 6,215,592 B1 | 4/2001 | Pelekhaty | 359/260 |
| 6,262,681 B1 | 7/2001 | Persechini | 342/188 |
| 6,348,890 B1 | 2/2002 | Stephens | 342/375 |
| 6,388,787 B1 | 5/2002 | Bischoff | 359/187 |
| 6,452,546 B1 | 9/2002 | Stephens | 342/368 |
| 6,580,532 B1 | 6/2003 | Yao et al. | 359/111 |
| 6,591,026 B2 | 7/2003 | Endo et al. | 385/15 |
| 6,643,299 B1 | 11/2003 | Lin | 372/6 |
| 6,724,523 B2 | 4/2004 | Yap | 359/333 |
| 6,724,783 B2 | 4/2004 | Jalali et al. | 372/9 |
| 6,731,829 B2 | 5/2004 | Ionov | 385/15 |
| 6,852,556 B2 | 2/2005 | Yap | 438/22 |
| 6,867,904 B2 | 3/2005 | Ng et al. | 359/332 |
| 6,872,985 B2 | 3/2005 | Yap | 257/82 |
| 6,940,878 B2 | 9/2005 | Orenstein et al. | 372/20 |
| 7,085,499 B2 | 8/2006 | Yap et al. | 398/123 |
| 2001/0038318 A1 | 11/2001 | Johnson et al. | 331/135 |
| 2002/0021464 A1 | 2/2002 | Way | 359/124 |
| 2002/0122615 A1 | 9/2002 | Painter et al. | 385/15 |
| 2003/0003961 A1 | 1/2003 | Li et al. | 455/562 |
| 2003/0080898 A1 | 5/2003 | Wang et al. | 342/359 |
| 2003/0089843 A1 | 5/2003 | Sayyah et al. | 250/227.21 |
| 2003/0090767 A1 | 5/2003 | Yap et al. | 359/181 |
| 2003/0091097 A1 | 5/2003 | Yap et al. | 375/132 |
| 2003/0197917 A1 | 10/2003 | Yap et al. | 359/330 |
| 2003/0227629 A1 | 12/2003 | Dobbs et al. | 356/437 |
| 2004/0120638 A1 | 6/2004 | Frick | 385/27 |
| 2004/0264977 A1 | 12/2004 | Yap et al. | 398/161 |
| 2005/0013612 A1 | 1/2005 | Yap | 398/53 |

FOREIGN PATENT DOCUMENTS

| | | |
|---|---|---|
| JP | 07-26136 | 7/1995 |
| JP | 07-264136 | 10/1995 |
| WO | 99/66613 | 12/1999 |
| WO | 00/44074 | 7/2000 |
| WO | 00/45213 A1 | 8/2000 |
| WO | 01/29992 A1 | 4/2001 |
| WO | 01/80507 A2 | 10/2001 |
| WO | 02/099939 A1 | 12/2002 |
| WO | 03/042734 A1 | 5/2003 |
| WO | 03/043126 A1 | 5/2003 |
| WO | 03/043147 A1 | 5/2003 |
| WO | 03/043177 A2 | 5/2003 |
| WO | 03/043178 A2 | 5/2003 |
| WO | 03/043195 A1 | 5/2003 |
| WO | 03/043231 A2 | 5/2003 |

OTHER PUBLICATIONS

U.S. Appl. No. 10/766,103, filed Jan. 24, 2004, Ng, et al.
Abstract of JP 07-264136, Patent Abstracts of Japan, vol. 1996, No. 2 (Feb. 1996).
Chang, K., Handbook of Microwave and Optical Components, *John Wiley and Sons*, pp. 595-626, 670-674 (1989).
Narayan, A., et al., "High-Efficiency Waveguide Coupled =1.3 μm $In_xGa_{-x}As/GaAs$ MSM Detector Exhibiting Large Extinction Ratios at L and X Band," IEEE Photonic Technology Letters, vol. 5, pp. 514-517 (1993).
Ng, W., et al., "High-Speed Single-and Multi-Element Fiber-Grating Coupled Diode laser Transmitters for WDM Networks," IEEE, pp. 362-363 (1998).
Oda, K., et al., "A Wide-FSR Waveguide Double-Ring Resonator for Optical FDM Transmission Systems," *Journal of Lightwave Technology*, vol. 9, No. 6, pp. 728-736 (Jun. 1991).
Zmuda, H., et al., "Photonic Beamformer for Phased Array Antennas Using a Fiber Grating Prism," *IEEE Photonics Technology Letters*, vol. 9, No. 2 pp. 241-243 (Feb. 1997).
Logan Jr., R., et al., "All-Optical Heterodyne RF Signal Generation Using a Mode-locked-laser Frequency Comb: Theory and Experiments", *Microwave Symposium Digest*, 200 IEEE, MTT-S Internal vol. 3, pp. 1741-1744 (Jun. 2000).
Gliese, U, et al., "A wideband heterodyne optical phase-locked loop for generation of 3-18 GHZ microwave carries", *IEEE Photonics Technology Letters*, vol. 4, pp. 936-938 (Aug. 1992).
U.S. Appl. No. 10/766,103, filed Jan. 24, 2004, Ng et al.
Agrawal, G.P., *Nonlinear Fiber Optics*, Academic Press, Chapter 9, pp. 370-398 (1995).
Alexe, M., et al., "Low Temperature GaAs/Si Direct Wafer Bonding," *Electronics Letters*, vol. 36, No. 7 (Mar. 30, 2000).
Bennett, S., et al., "1.8-THz Bandwidth, Zero-Frequency Error, Tunable Optical Comb Generator for DWDM Applications," *IEEE Photonics Technology Letters*, vol. 11, No. 5, pp. 551-553 (May 1999).
Berger, J.D., et al., "Widely Tunable External Cavity Diode Lase Base On A MEMS Electrostatic Rotary Actuator," *Paper TuJ2-1, OFC*, Anaheim, California, pp. TuJ2-1-TuJ2-3 (2001).
Bilodeau, F., et al., "An All-Fiber Dense-Wavelength-Division Multiplexer/ Demultiplexer Using Photoimprinted Bragg Gratings," *IEEE Photonics Technology Letters*, vol. 7, No. 4, pp. 388-380 (Apr. 1995).
Bordonalli, A.C., et al., "High-Performance Phase Locking of Wide Linewidth Semiconductor Lasers by Combined Use of Optical Injection Locking and Optical Phase-Lock Loop," *Journal of Lightwave Technology*, vol. 17, No. 2, pp. 328-342 (Feb. 1999).
Chan, W.K., et al., "Grafted Semiconductor Optoelectronics," *IEEE Journal Of Quantum Electronics*, vol. 27, No. 3, pp. 717-725 (Mar. 1991).
Chu, S.T, et al., "An Eight-Channel Add-Drop Filter Using Vertically Coupled Microring Resonators over a Cross Grid," *IEEE Journal of Technology Letters*, vol. 11, No. 6, pp. 691-693 (Jun. 1999).
Chu, S.T., et al., "Wavelength Trimming of a Microring Resonator Filter by Means of a UV Sensitive Polymer Overlay," *IEEE Photonics Technology Letters*, vol. 11, No. 6, pp. 688-690 (Jun. 1999).
Collins, J.V., et al., "Passive Alignment of Second Generation Optoelelectronic Devices," *IEEE Journal of Selected Topics In Quantum Electronics*, vol. 3, No. 6, pp. 1441-1444 (Dec. 1997).
Corbett, B. et al., "Low-Threshold Lasing in Novel Microdisk Geometries," *IEEE Photonics Technology Letters*, vol. 8, No. 7, pp. 855-857 (Jul. 1996).
Corbett, B., "Spectral Characteristics of Low Threshold Microdisks," *IEEE Lasers and Electro-Optics Society 1996 Annual Meeting*, vol. 2, pp. 197-198 (1996).
Deckman, B., et al., "A 5-Watt, 37-GHz Monolithic Grid Amplifier," *IEEE MTT-S Digest*, pp. 805-808 (2000).
Escalera, N., et al., "Ka-Band, 30 Watts Solid State Power Amplifier," *IEEE MTT-S Digest*, paper TU1F-42, pp. 561-563 (2000).
Fukushima, S., et al., "Direct Opto-Electronic Sythesis of mW-Level Millimeter-Wave Signals Using An Optical Frequency Comb Generator and a Uni-Traveling-Carrier Photodiode," *IEEE MTT-S Digest*, pp. 69-72 (2001).
Ghirardi, F., et al., "Monolithic Integration of an InP Based Polarization Diversity Heterodyne Photoreceiver with Electrooptic Adjustability," *Journal of Lightwave Technology*, vol. 13, No. 7, pp. 1536-1549 (Jul. 1995).
Goldsmith, C.L., et al., "Principles and Performance of Traveling-Wave Photodetector Arrays," *IEEE Transactions on Microwave Theory and Techniques*, vol. 45, No. 8, pp. 1342-1350 (Aug. 1997).

Hansen, D.M., et al., "Development Of A Glass-Bonded Complaint Substrate," *Journal of Crystal Growth*, vol. 195, pp. 144-150 (1998).

Haus, H., et al., "Narrow-Band Optical Channel-Dropping Filter," *Journal of Lightwave Technology*, vol. 10, No. 1, pp. 57-61 (Jan. 1992).

Ibsen, M., et al., "30dB Sampled Gratings In Germanosilicate Planar Waveguides," *Electronics Letters*, vol. 32, No. 24, pp. 2233-2235 (Nov. 21, 1996).

Ih, C.S., et al., "Dense All Optical WDM-SCM Technology for High Speed Computer Interconnects," *Optoelectronic Interconnects*, SPIE, vol. 1849, pp. 308-318 (1993).

Ingram, D.L., et al., "Compact W-Band Solid-State MMIC High Power Sources," *IEEE MTT-S Digest*, pp. 955-958 (2000).

Jayaraman, V., et al., "Extended Tuning Range in Sampled Grating DBR Lasers," *IEEE Photonics Technology Letters*, vol. 5, No. 5, pp. 489-491 (May 1993).

Johansson, L.A., et al., "Millimeter-Wave Modulated Optical Signal Generation with High Spectral Purity and Wide-Locking Bandwidth Using a Fiber-Integrated Optical Injection Phase-Lock Loop," *IEEE Photonics Technology Letters*, vol. 12, No. 6, pp. 690-692 (Jun. 2000).

Kato, K., et al., "PLC Hybrid Integration Technology And Its Application To Photonic Components," *IEEE Journal of Selected Topics in Quantum Electronics*, vol. 6, No. 1, pp. 4-13 (2000).

Kato, K., "Ultrawide-Band/High-Frequency Photodetectors," *IEEE Transactions on Microwave Theory and Techniques*, vol. 47, No. 7, pp. 1265-1281 (Jul. 1999).

Kazarinov, R., et al., "Narrow-Band Resonant Optical Reflectors and Resonant Optical Transformers for Laser Stabilization and Wavelength Division Multiplexing," *IEEE Journal of Quantum Electronics*, vol. QE-23, No. 9, pp. 1419-1425 (Sep. 1987).

Kazovsky, L.G., et al., "A 1320-nm Experimental Optical Phase-Locked Loop: Performance Investigation and PSK Homodyne Experiments at 140 Mb/s and 2 Gb/s," *Journal of Lightwave Technology*, vol. 8, No. 9, pp. 1414-1425 (Sep. 1990).

Kikuchi, K., et al., "Amplitude-Modulation Sideband Injection Locking Characteristics of Semiconductor Lasers and their Application," *Journal of Lightwave Technology*, vol. 6, No. 12, pp. 1821-1830 (Dec. 1988).

Kitayama, K., "Highly-Stabilized, Tunable Millimeter-Wave Generation by Using Fiber-Optic Frequency Comb Generator," *Microwave Photonics*, pp. 13-16 (Dec. 3, 1996).

Kobayashi, Y., et al., "Optical FM signal Amplification and FM Noise Reduction in an Injection Locked AlGaAs Semiconductor Laser," *Electronics Letters*, vol. 17, No. 22, pp. 849-851 (Oct. 29, 1981).

Lee, C.C., et al., "Measurement of Stimulated-Brillouin-Scattering Threshold for Various Types of Fibers Using Brillouin Optical-Time-Domain Reflectometer," *IEEE Photonics Technology Letters*, vol. 12, No. 6, pp. 672-674 (Jun. 2000).

Little, B.E., et al., "Ultra-Compact Si-SiO$_2$ Microring Resonator Optical Channel Dropping Filters," *IEEE Photonics Technology Letters*, vol. 10, No. 4, pp. 549-551 (Apr. 1998).

Little, B.E., "Vertically Coupled Glass Microring Resonator Channel Dropping Filters," *IEEE Photonics Technology Letters*, vol. 11, No. 2, (Feb. 1999).

Little, B.E., et al., "Wavelength Switching and Routing Using Absorption and Resonance," *IEEE Photonics Technology Letters*, vol. 10, No. 6, pp. 816-818 (Jun. 1998).

Liu, T., et al., "InP-Based DHBT with 90% Power-Added Efficiency and 1 W Output Power at 2 GHZ," *Solid-State Electronics*, vol. 41, No. 10, pp. 1681-1686 (1997).

London, J.M., "Preparation of Silicon-on-Gallium Arsenide Wafers for Monolithic Optoelectronic Integration," *IEEE Photonics Technology Letters*, vol. 11, No. 8, pp. 958-960 (1999).

MacDonald, R.I., et al., "Hybrid Optoelectronic Integrated Circuit," *Applied Optics*, vol. 26, No. 5, pp. 842-844 (Mar. 1, 1987).

Murthy, S., et al. "A Novel Monolithic Distributed Traveling-Wave Photodector with Parallel Optical Feed," *IEEE Photonics Technology Letters*, vol. 12, No. 6, pp. 681-683 (Jun. 2000).

Ng., W., et al., "High-Efficiency Waveguide-Coupled $\lambda$=1.3 $\mu$m In$_x$Ga$_{1-x}$As/GaAs MSM Detector Exhibiting Large Extinction Ratios at L and X Band", *IEEE Photonics Technology Letters*, vol. 5. No. 5, pp. 514-517 (1993).

Ng, W., et al., "High-Speed Single-and Multi-Element Fiber-Grating Coupled Diode Laser Transmitters for WDM Networks," *IEEE*, pp. 362-363 (1998).

*Radio Frequency Photonic Synthesizer*, United Telecommunications Products, Inc., Chalfont, PA, Transmission Systems Division, (Jan. 2000).

Ramos, R.T., et al., "Optical Injection Locking and Phase-Lock Loop Combined Systems," *Optics Letters*, vol. 19, No. 1, pp. 4-6 (Jan. 1, 1994).

Sakamoto, S.R., et al., "Substrate Removed GaAs-AlGaAs Electrooptic Modulators", *IEEE Photonics Technology Letters*, vol. 11, No. 10, pp. 1244-1246 (1999).

Sarlet, G., et al., "Wavelength and Mode Stabilization of Widely Tunable SG-DBR and SSG-DBR Lasers," *IEEE Photonics Technology Letters*, vol. 11, No. 11, pp. 1351-1353 (Nov. 1999).

Sayyah, K., et al., "Multi-Tone Photonic Oscillator," *Proceedings of the SPIE*, vol. 4490, pp. 52-62 (2001).

Schäffer, C.G., "Application of Optical Amplifiers in a Microwave Distribution Network for Phased Array Antennas," *Lasers and Electro-Optics Society Annual Meeting, 1995, 8th Annual Meeting Conference Proceedings*, vol. 1, pp. 202-203 (Oct. 30-31, 1995).

Shimizu, N., et al., "InP-InGaAs Uni-Traveling-Carrier Photodiode With Improved 3-dB Bandwidth of Over 150 GHz," *IEEE Photonics Technology Letters*, vol. 10, No. 3, pp. 412-414 (Mar. 1998).

Tishinin, D.V., et al., "Vertical Resonant Couplers with Precise Coupling Efficiency Control Fabricated by Wafer Bonding", *IEEE Photonics Technology Letters*, vol. 11, No. 8, pp. 1003-1005 (1999).

Tsao, S.-L, "Phaselocked Tunable Subcarrier Comb Generator," *Electronics Letters*, vol. 30, No. 24, pp. 2059-2060 (Nov. 24, 1994).

Yamamoto, T., et al., "270-360 Ghz Tunable Beat Signal Light Generator For Photonic Local Oscillator," *Electronics Letters*, vol. 38, No. 15, pp. 795-797 (Jul. 2002).

Yanagisawa, M., et al., "Film-Level Hybrid Integration of AlGaAs Laser Diode with Glass Waveguide on Si Substrate," *IEEE Photonics Technology Letters*, vol. 4, No. 1, pp. 21-23 (Jan. 1992).

Yao, X.S., et al., "High Frequency Optical Subcarrier Generator," *Electronics Letters*, vol. 30, No. 18, pp. 1525-1526 (Sep. 1, 1994).

Yao, X.S., "High-Quality Microwave Signal Generation by Use of Brillouin Scattering in Optical Fibers," *Optics Letters*, vol. 22, No. 17, pp. 1329-1331 (Sep. 1, 1997).

Yao, X.S., "Multiloop Optoelectronic Oscillator," *IEEE Journal of Quantum Electronics*, vol. 36, No. 1, pp. 79-84 (Jan. 2000).

Yao, X.S., et al., "Optoelectronic Microwave Oscillator," *J. Opt. Soc. Am. B*, vol. 13, No. 8, pp. 1725-1735 (Aug. 1996).

Yao, X.S., et al., "Optoelectronic Oscillator for Photonic Systems," *IEEE Journal of Quantum Electronics*, vol. 32, No. 7, pp. 1141-1149 (Jul. 1996).

Yap, D., et al., "Agile Waveform Generation & Frequency Conversion," *RF-Lightwave Integrated Circuits Program Kickoff Meeting*, pp. DY1-DY10 (Aug. 16, 2000).

Yap, D.. et al., "Switched Photonic Link for Distribution of Local-Oscillator Signals," *IEEE Photonics Technology Letters*, vol. 12, No. 11, pp. 1552-1554 (Nov. 2000).

Yi-Yan, A., et al. "GaInAs/InP pin Photodetectors Integrated with Glass Waveguides," *Electronics Letters*, vol. 27, No. 1, pp. 87-89 (Jan. 3, 1991).

Yi-Yan, A., et al., "Semiconductor-Film Grafting: A New Approach to OEICs," *Circuits & Devices*, pp. 26-30 (May 1992).

Bilodeau, F., et al., "An All-Fiber Dense-Wavelength-Division Multiplexer/Demultiplexer Using Photoimprinted Bragg Gratings," *IEEE Photonics Technology Letters*, vol. 7, No. 4, pp. 388-390 (Apr. 1995).

Madsen, C.K., et al., "Planar Waveguide Optical Spectrum Analyzer Using a UV-Induced Grating," *IEEE Journal of Selected Topics in Quantum Electronics*, vol. 4, No. 6, pp. 925-929 (Nov./Dec. 1998).

Tishinin, D.V., et al., "Vertical Resonant Couplers with Precise Coupling Efficiency Control Fabricated by Wafer Bonding," *IEEE Photonics Technology Letters*, vol. 11, No. 8, pp. 1003-1005 (Aug. 1999).

Selected Definitions from Wikipedia at http://en.wikipedia.org accessed Jul. 27, 2006.

* cited by examiner

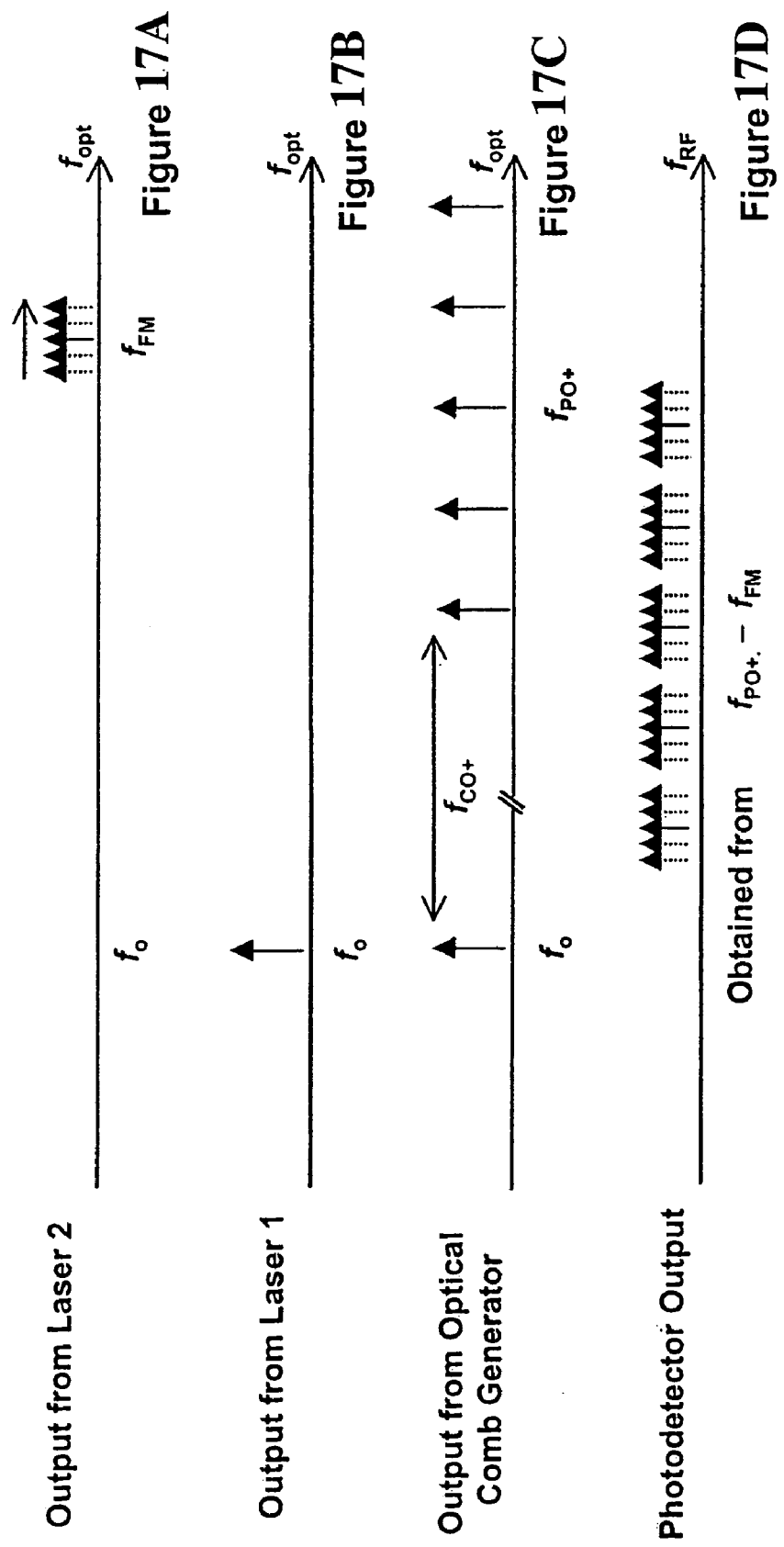

METHOD AND APPARATUS FOR WAVEFORM GENERATION

CROSS REFERENCE TO RELATED APPLICATIONS

This application is a continuation-in-part and claims the benefit of International Application No. PCT/US02/36849, filed Nov. 15, 2002, which is a continuation-in-part and claims the benefit of U.S. application Ser. No. 10/116,829, filed Apr. 5, 2002, which claims the benefit of U.S. Provisional Application No. 60/332,372, filed Nov. 15, 2001. The entire contents of International Application No. PCT/US02/36849, U.S. application Ser. No. 10/116,829, and U.S. Provisional Application No. 60/332,372 are hereby incorporated by reference herein.

This application is also a continuation-in-part and claims the benefit of International Application No. PCT/US02/36982, filed Nov. 15, 2002, which is a continuation-in-part and claims the benefit of U.S. application Ser. No. 10/116,829, filed Apr. 5, 2002, which claims the benefit of U.S. Provisional Application No. 60/332,372, filed Nov. 15, 2001. The entire contents of International Application No. PCT/US02/36982 are hereby incorporated by reference herein.

This application is related to a provisional patent application entitled "Agile RF-Lightwave Waveform Synthesis and an Optical Multi-Tone Amplitude Modulator" bearing Ser. No. 60/332,367 and filed Nov. 15, 2001, and its corresponding non-provisional application bearing Ser. No. 10/116,801 and filed on Apr. 5, 2002, the disclosures of which are hereby incorporated herein by this reference. These related applications are owned by the assignee of this present application.

This application is also related to a provisional patent application entitled "Injection-seeding of a Multi-tone Photonic Oscillator" bearing Ser. No. 60/332,371 and filed Nov. 15, 2001, and its corresponding non-provisional application bearing Ser. No. 10/116,799 and filed on Apr. 5, 2002, the disclosures of which are hereby incorporated herein by this reference. These related applications are owned by the assignee of this present application.

This application is also related to a provisional patent application entitled "Remotely Locatable RF Power Amplification System" bearing Ser. No. 60/332,368 and filed Nov. 15, 2001, and its corresponding non-provisional application bearing Ser. No. 10/116,854 and filed on the Apr. 5, 2002, the disclosures of which are hereby incorporated herein by this reference. These related applications are owned by the assignee of this present application.

This application is also related to a provisional patent application entitled "Low Noise Switchable RF Lightwave Synthesizer," bearing Ser. No. 60/373,739 and filed Apr. 17, 2002, and its corresponding non-provisional application bearing Ser. No. 10/417,011 and filed on Apr. 16, 2003, the disclosures of which are hereby incorporated herein by this reference. These related applications are owned by the assignee of this present application.

STATEMENT REGARDING FEDERALLY SPONSORED RESEARCH OR DEVELOPMENT

This invention was made with support from the United States Government under Contract No. F33615-00-C-1674 awarded by AFRL. The Government has certain rights in the invention.

BACKGROUND

1. Field

This disclosure relates to a radio frequency-lightwave (RF-lightwave) waveform generator capable of generating a set of frequency-spread and frequency-hopped or frequency modulated radio frequency (RF) waveforms. This disclosure also relates to the generation of multi-tone optical combs with a photonic oscillator that may be used with or as part of the waveform generator. This disclosure also relates to pre-processing of the frequency-spread and frequency-hopped or frequency modulated radio frequency (RF) waveforms. The generated waveforms may be further amplitude-modulated with a pulse code and may be used, for example, as transmit waveforms for a radar system. Pre-processing may be used on a receive waveform or radar return signal. This pre-processing can then effectively create multiple short pulses from a single long pulse and combine the information from those short pulses.

2. Description of Related Art

A multi-tone, frequency-hopped or frequency-modulated RF-lightwave waveform may function as a lightwave carrier for an optical transmission channel. The RF signal information carried by the optical transmission channel may be a pulse code, for example, which may be imposed onto the multi-tone, frequency-hopped or frequency-modulated RF-lightwave carrier by means of a lightwave modulator. The final RF-lightwave waveform can be transmitted (by means of an optical fiber link or a free-space optical link) to a photo-receiver. The photoreceived signal, which is in electronic form (frequency converted and demodulated), can then be transmitted through a RF channel (an antenna or wireless link).

Multi-tone frequency spreading may be used to make the resultant signal difficult for a non-coherent receiver to detect. Use of a frequency-spread carrier is one method to produce a signal that has Low Probability of Interception (LPI) by conventional intercept receivers. In addition, if the precise frequency of the carrier can be changed and is unknown to the interceptor, LPI performance is enhanced. These techniques are useful in LPI radar and communication systems.

Typically, an interceptor would use a wideband receiver that is channelized into smaller frequency bands to detect and identify the signal. If the signal falls within a single channel of the receiver, then it can be detected. However, if the signal is spread in frequency so those portions of it fall within many channels, it is difficult for the interceptor to distinguish that signal from the background noise. Typically, the channels of the intercept receiver may be scanned or long integration times may be used to sense an incoming signal. If the signal frequency is varied rapidly to move between different channels within the sensing time, it also appears like noise. Alternatively, if the signal frequencies are varied rapidly with time although those hops lie within the received channels, that signal will be detected but difficult to identify. The dense, multi-tone waveforms that can be generated by periodic frequency modulation can be designed to have a spacing that is smaller than the multi-tone waveform produced by the photonic oscillator to allow intercept receivers having smaller channel spacings to be defeated.

Another purpose of frequency spreading is to make a signal less susceptible to jamming. The frequency coverage of the jammer may not be as large as the coverage of the frequency-spread carrier. In addition, since the frequency-spread carrier consists of discrete tones that can be summed coherently, the signal power is used more efficiently. This is in contrast to the jammer, which is uniformly broadband. Rapid switching of the signal band also makes it less susceptible to being jammed, since the jammer cannot predict from one signal pulse to the next which frequency to jam.

Previous methods to achieve LPI performance are based on using electronic synthesizers to produce the waveforms. Typically, a pulse-compression code is used to phase modulate a single-tone carrier and spread the spectrum. For example, if the signal pulse is 1 μsec wide and a 100-to-1 pulse compression code is used, a signal bandwidth of 100 MHz is obtained. The channel bandwidth of the interrogating receiver is typically much narrower than this. The bandwidth of present high-dynamic-range analog-to-digital converters is typically 100 MHz or less. Thus, interrogator channel bandwidths are also 100 MHz or less. Thus, being able to produce signals with a frequency range much greater than 100 MHz allows for such interrogators to be defeated. Methods known in the art to generate multi-tone wavelengths may use electronic synthesizers to produce the waveforms. Multiple separate electronic synthesizers may be used, but only a small number of tones may be produced to cover large bandwidth. Alternatively, frequency tunable electronic synthesizers may produce a waveform having a Fourier spectrum that contains a larger number of tones, but over a much smaller bandwidth. Gradual modulation or chirping of the frequency of a single tone waveform for the purpose of pulse compression is known in the art. Frequency modulation to compress a single tone pulse is common and large frequency excursions and pulse-compression ratios are possible. However, frequency modulation to compress a multi-tone pulse has been difficult to accomplish. Frequency modulation of a large number of tones has previously been cumbersome and expensive to implement. Hence, an apparatus and method that provides for frequency modulation of a large number of tones with less complexity and/or expense would be desirable.

LPI waveforms typically have low instantaneous transmitted power. In order to increase the transmitted power, a longer radar pulse may be used. However, long pulses have poor resolution of the target range, since returns that occur within a given pulse duration are not distinguishable. Methods are known in the art for processing FM waveforms for achieving pulse compression and improved range resolution. Some of the known methods mix the Transmit and Receive waveforms to compare them. However, a priori knowledge of the approximate target range may be needed to synchronize the two waveforms in these known methods. Therefore, an apparatus and method that does not require a priori knowledge of the approximate target range would be desirable for the determination of the actual range.

Prior art methods to process multi-tone waveforms typically involve using a bank of filters to spectrally separate those tones, which then can be processed individually. Usually, these methods can accommodate only tones of fixed frequency. Hence, an apparatus and method that can process variable frequency, frequency-modulated, multi-tone waveform would be desirable.

The prior art includes:

1. A single-tone, single-loop optoelectronic oscillator—see U.S. Pat. No. 5,723,856 issued Mar. 3, 1998 and the article by S. Yao and L. Maleki, IEEE J. Quantum Electronics, v.32, n.7, pp.1141-1149, 1996. A photonic oscillator is disclosed (called an optoelectronic oscillator by the authors). This oscillator includes a single laser and a closed loop comprised of a modulator, a length of optical fiber, a photodetector, an RF amplifier and an electronic filter. The closed loop of this oscillator bears some similarity to the present invention. However, the intent of this prior art technique is to generate a single tone by incorporating an electronic narrow-band frequency filter in the loop. A tone that has low phase noise is achieved by using a long length of the aforementioned fiber. Demonstration of multiple tones is reported in this article achieved by enlarging the bandwidth of the filter. However, the frequency spacing of those multiple tones was set by injecting a sinusoidal electrical signal into the modulator. The frequency of the injected signal is equal to the spacing of the tones. This method causes all of the oscillator modes (one tone per mode) to oscillate in phase. As a result, the output of this prior art oscillator is a series of pulses. See FIG. 14(b) of this article.

2. A single-tone, multiple-loop optoelectronic oscillator—see U.S. Pat. No. 5,777,778 issued Jul. 7, 1998 and the article by S. Yao and L. Maleki, IEEE J. Quantum Electronics, v.36, n.1, pp.79-84, 2000. An optoelectronic oscillator is disclosed that uses multiple optical fiber loops, as the time-delay paths. One fiber loop has a long length and serves as a storage medium to increase the Q of the oscillator. The other fiber loop has a very short length, typically 0.2 to 2 m, and acts to separate the tones enough so that a RF filter can be inserted in the loop to select a single tone. The lengths of the two loops, as well as the pass band of the RF filter, can be changed to tune the frequency of the single tone that is generated. This approach teaches away from the use of multiple optical loops to obtain multiple tones, since it uses the second loop to ensure that only a single tone is produced.

3. 1.8-THz bandwidth, tunable RF-comb generator with optical-wavelength reference—see the article by S. Bennett et al. Photonics Technol. Letters, Vol. 11, No. 5, pp. 551-553, 1999. This article describes multi-tone RF-lightwave comb generation using the concept of successive phase modulation of a laser lightwave carrier in an amplified re-circulating fiber loop. The lightwave carrier is supplied by a single input laser whose optical CW waveform is injected into a closed fiber loop that includes an optical phase modulator driven by an external RF generator. This results in an optical comb that has a frequency spacing determined by the RF frequency applied to the phase modulator and absolute frequencies determined by the wavelength of the input laser. The loop also contains an Er-doped optical fiber amplifier segment that is pumped by a separate pump laser. The effect of the optical amplifier in the re-circulating loop is to enhance the number of comb lines at the output of the comb generator. One may expect some mutual phase locking between the different comb lines since they are defined by the phase modulation imposed by the external RF generator. This approach does not include a photodetector in the loop.

4. One technique for generating a RF signal is by optical heterodyning. See FIG. 1. With this technique, as shown in FIG. 1, the optical outputs of two laser wavelengths produced by a RF-lightwave synthesizer are combined onto a photodetector. In a simple example, the RF-lightwave synthesizer may consist of two lasers each producing single wavelengths, i.e., a single optical frequency, spectral tone, or single spectral line. When the combined output of the two lasers is converted by a photodetector into an electronic signal, that electronic signal has frequency components at the sum and difference of the two laser lines. The photodetector output is proportional to the incident optical power (or the square of the electric field of the incident light). The sum frequency is a very high optical frequency, while the difference frequency is typically in the RF range. The photodetector may also be used with electronic bandpass or low-pass filters or the photodetector itself may act as a low-pass frequency filter so that only the heterodyne difference frequency in the desired range of frequencies is output from the photodetector as a current or voltage.

In order for the heterodyne output produced by the photodetector to have low phase noise, the two laser lines must be locked together, so that their fluctuations are coherent. Various methods known in the art can be employed to achieve this locking. One technique is to optical-injection lock both lasers (typically referred to as slave lasers) to different phase-locked tones (or spectral lines) that are emitted by a third laser (typically referred to as a master laser).

Optical heterodyning can be combined with an external optical modulator to perform frequency conversion (frequency translation). This function is also illustrated in FIG. 1. A dual-line lightwave output of an RF-lightwave synthesizer (such as one or both of the tones that are output from the two slave laser discussed above) is supplied to an optical intensity modulator, with a typical modulator being a Mach-Zehnder interferometer. A RF input signal may also be supplied to the modulator, which applies an intensity modulation onto the lightwave signal. The transfer function of the modulator results in the generation of frequency sum and difference terms. The output of the photodetector is another RF signal with frequency components that are the sum and difference between the frequencies of the RF input $\omega_{RF}$ and the frequency spacing between the two laser lines. In essence, the frequency difference $\omega_{LO}$ of the two laser-lines acts as a local-oscillator (LO) frequency that is multiplied with the RF input signal to produce an intermediate frequency (IF) $\omega_{LO}-\omega_{RF}$. A mathematical expression for this process is given as:

$$i_D = \frac{\alpha I_o}{2L_{MOD}}\left\{1 + \sin(\omega_{RF}t) + M\cos(\omega_{LO}t + \phi) \pm \frac{1}{2}mM\sin[(\omega_{LO} \pm \omega_{RF})t + \phi]\right\}$$

where $i_D$ is the photocurrent output from the photodetector.

5. A Brillouin opto-electronic oscillator described by Yao in U.S. Pat. No. 5,917,179 issued Jun. 29, 1999. The oscillator disclosed by Yao produces a single tone rather than multiple tones. Further, the oscillator makes use of stimulated Brillouin scattering (SBS) in an optical fiber in the opto-electronic feedback path of the oscillator. This feedback path may have one or more optical and/or electrical loops. The SBS of light provided by a pump laser produces a second optical signal that also is fed to the photodetector in the path. The frequency of this second signal is used to define the frequency of the electrical drive signal for the optical modulator of the path. The photodetector produces an electrical signal that is the beat of the SBS-produced and the modulator-output optical signals. This beat signal is used to drive the optical modulator and create another modulated output signal that is fed into the optical fiber exhibiting SBS. This approach uses SBS of the light generated by a pump beam. It does not uses SBS of light derived from the output of the optical modulator.

SUMMARY

Embodiments of the present invention make use of the wideband nature of photonics to generate dense, frequency-spread, comb waveforms. The total bandwidth of the comb can be quite wide, with several GHz bandwidths easily achieved by the photonic methods according to embodiments of the present invention. The finely spaced tones are produced by frequency modulation using an electronic method, which has fine frequency resolution. Embodiments of the present invention also make use of the properties of optical injection locking and heterodyning to frequency modulate a comb of many tones.

According to embodiments of the present invention, a generator of the RF-lightwave carrier may include a frequency-comb generator that is coupled to an optical-heterodyne synthesizer. The comb is a set of RF tones amplitude-modulated onto a lightwave carrier. The generator of the RF-lightwave frequency comb is preferably a photonic oscillator. The optical heterodyne synthesizer produces a pair of phase-locked, CW lightwave lines (at two different optical wavelengths). One of these lightwave lines may have the RF comb modulated onto it. The other lightwave line may have a wavelength that is rapidly modulated. Both lines, after being modulated by the comb, are then combined to generate the agile carrier. The center frequency of the photoreceived signal is the heterodyne beat note, which is the difference between the frequencies of the two lightwave lines produced by the optical heterodyne synthesizer. This process modulates the center frequency of the resultant multi-tone RF lightwave carrier. If the modulation is periodic, the resultant multiline RF-lightwave carrier has additional tones associated with the Fourier spectral components arising from the modulation. If the frequency modulation is slow compared to the frequency spacing of the comb, the photoreceived signal is a separate comb that is more dense (i. e., having multiple lines of smaller frequency spacing) than the comb generated by the photonic oscillator.

Embodiments of this invention preferably make use of the wideband nature of photonics to generate frequency-spread waveforms. The total bandwidth of the comb can be quite wide, with several tens of GHz bandwidths easily achieved by the photonic methods of this invention. A pulse-compression code may be modulated onto the multi-tone comb, in addition to the signal information, to further spread the carrier. Prior art digital synthesizers which produce frequency-stepped waveforms typically have a bandwidth of less than 100 MHz. The switchable, optical-heterodyne synthesizer disclosed herein is capable of a frequency range that exceeds 100 GHz. As discussed above, this frequency range is much greater than that typically used in interrogating receivers, making embodiments of the present invention particularly useful in LPI applications.

The agile frequency spread waveform generator disclosed herein also is useful for communication systems with multiple users. Each user is assigned a particular and unique pattern for the frequency hops of the multi-tone waveform. A user can distinguish its signal from other signals that occupy the same band of frequencies by coherently processing the received signal with a copy of the particular waveform pattern of that user. This type of Code Division Multiple Access (CDMA) for lightwave waveforms is different from prior methods.

The prior methods make use of short optical pulses, much shorter than the information pulse, whose wavelength and temporal location can be different for each user.

In embodiments of the present invention, a generator applies a frequency modulation to a multi-tone RF carrier waveform. In one embodiment, a periodic electronic frequency modulation is combined with multi-tone generation by a photonic oscillator to produce a dense frequency-spread comb that has both fine comb spacing and large overall bandwidth. The density of this comb is greater than the density of combs typically generated with prior approaches. A dense, multi-tone Transmit waveform generated according to some embodiments of the present invention has a lower probability of being detected by an electronic intercept receiver than that typically provided by other apparatus or methods known in the art. Another embodiment according to the present invention combines frequency modulation by a single-value invertible (SVI) function with multi-tone generation by a photonic oscillator to encode different temporal portions of that waveform so that they are distinct from each other. Such a multi-tone frequency-encoded waveform can be combined with a suitable receiver to achieve temporal compression of a pulse frequency spread comb.

In another embodiment of the present invention, a pre-processor may be used for the return or Receive frequency-coded waveform that achieves pulse compression. As discussed above, processing of long pulses used in radar system to determine range typically requires a priori knowledge of the approximate target range. In some embodiments of the present invention, a priori knowledge is not needed. Instead, the pre-processor makes multiple time-delayed copies of the Transmit reference waveform and repeatedly presents them for comparison with the Receive waveform. Further, the pre-processor according to some embodiments of the present invention can also accommodate a frequency modulated, multi-tone waveform, unlike prior art apparatus, which typically require tones of fixed frequency.

Embodiments of the present invention provide an agile or a frequency modulated spread spectrum waveform generator. The generator may comprise: a photonic oscillator comprising a multi-tone optical comb generator for generating a series of RF comb lines on an optical carrier; an optical heterodyne synthesizer, the optical heterodyne synthesizer including first and second phase-locked lasers, the first laser feeding the multi-tone optical comb generator and the second laser comprising a wavelength-modulated or wavelength-tunable single tone laser whose output light provides a frequency translation reference; and a photodetector for heterodyning the frequency translation reference with the series of RF comb lines on the optical carrier generated by the photonic oscillator to generate an agile spread spectrum waveform.

In another aspect, the present invention provides a method of generating an agile or a frequency modulated spread spectrum waveform, the method comprising the steps of: generating a multi-tone optical comb as a series of RF comb lines on an optical carrier; generating a wavelength-tunable or wavelength-modulated single tone frequency translation reference; and optically combining the optical comb with the frequency translation reference to generate a lightwave waveform suitable for subsequent heterodyning.

In still another aspect, an embodiment of the present invention provides a multi-tone photonic oscillator comprising: a laser producing an optical carrier wave; a first optical branch comprising a first optical delay element; a second optical branch comprising a main optical fiber having a forward direction of light propagation; a third optical branch, the third optical branch providing a Stokes beam to the second optical branch, the Stokes beam propagating in the main optical fiber in a direction opposite to the forward direction of light propagation; and a common path, the common path comprising: an optical portion having an optical modulator receiving the optical carrier wave and providing an optical signal to the first optical branch, the second optical branch, and the third optical branch; and, an electrical portion having at least one photodetector coupled to the first optical branch and the second optical branch, the at least one photodetector producing an electrical signal coupled to the optical modulator.

In another aspect, an embodiment of the present invention provides a method of generating a multi-tone optical comb, the method comprising the steps of: modulating an optical signal from a laser with an optical modulator to provide a modulated optical signal; delaying the modulated optical signal in a first optical branch to provide a first delayed optical signal; propagating the modulated optical signal in a forward direction in a second optical branch to provide a second delayed optical signal; generating Stokes light from the modulated optical signal; injecting the Stokes light into the second optical branch so that the Stokes light propagates in a reverse direction to the modulated optical signal in the second optical branch, wherein the Stokes light acts as a seed for stimulated Brillouin scattering in the second optical branch; photodetecting the first delayed optical signal and the second delayed optical signal to produce an electrical signal; and controlling the optical modulator with the electrical signal.

In yet another aspect, an embodiment of the present invention provides an apparatus for generation of frequency modulated, multi-tone waveforms (especially pulses) and an apparatus for pre-processing of such waveforms. The frequency modulated, multi-tone waveform generated can further be amplitude-modulated with a pulse code and can serve as a Transmit waveform for a radar system. The pre-processor processes the Receive waveform or radar return signal. The preprocessing effectively creates multiple short pulses from a single long pulse and combines the information from those short pulses.

According to the yet another aspect, embodiments of the present invention have a generator which applies frequency modulation to a multi-tone RF carrier waveform. In one embodiment, a periodic electronic frequency modulation is combined with multi-tone generation by a photonic oscillator to produce a dense frequency-spread comb that has both fine comb spacing and large overall bandwidth. The density of this comb is greater than the density of combs generated with prior approaches. Such a dense, multi-tone Transmit waveform has low probability of being detected by an electronic intercept receiver. In another embodiment, frequency modulation by a single-value invertible (SVI) function is combined with multitone generation by a photonic oscillator to encode different temporal portions of the waveform so that the portions are distinct from each other. Such a frequency-encoded waveform can be combined with a suitable receiver to achieve temporal compression of a pulsed frequency spread comb. The generator can make use of the frequency selection property arising from the finite injection-locking bandwidth and short response lifetime of optical-injection locked lasers. A master laser is amplitude-modulated by an electronic frequency-modulated RF tone. Two slave lasers that are coupled to the master laser are biased to select, respectively, the optical carrier of the master laser and the RF-modulated sideband. The output of one slave laser has a wavelength that is modulated according to the electronic frequency modulation and represents the first RF-lightwave signal. The output of the other slave laser is fed to an optical comb generator, which amplitude-modulates onto that optical carrier a comb of tones. This second RF-lightwave signal is a frequency spread signal with tones separated by a coarse spacing but covering a large bandwidth. These two RF-lightwave signals are then combined by optically heterodyning them at one or more photodetectors.

For a periodic frequency modulation, the first signal has a Fourier spectrum that consists of a dense small-bandwidth comb. In contrast, the second signal has a coarse large-bandwidth comb. Optical heterodyning of multiple RF-lightwave signals incident on the photodetector is used to interlace the dense small-bandwidth comb (of Fourier spectral components) with the separate coarse large-bandwidth comb (whose tones are different modes of the photonic oscillator). The result is a multi-tone RF waveform that has a much larger number of tones than can be produced by conventional electronic frequency modulation alone, or by a multi-tone photonic oscillator alone.

For SVI frequency modulation, the optical-heterodyned signal is a comb of tones whose frequencies vary slowly and have a temporal variation that can be described by a SVI function. Thus, each temporal interval of the comb can be distinguished from each other temporal interval by the distinct frequencies of the tones at those times. Typically, the comb waveform is part of a long temporal pulse (or series of pulses). The frequency modulation makes the long comb pulse appear like a series of short adjoining comb pulses. If these pulses in the series are combined or overlayed together, the result is a time-compressed pulse.

In still another aspect, a Receiver contains a pre-processor that achieves pulse compression of the multi-tone waveforms. The pre-processing achieves temporal division of the multi-tone Transmit reference carrier waveform and the Receive (or radar return) waveform into series of segments. This feature permits multiple time-staggered sets of the Transmit reference segments to be made. These reference segments may then be used for comparison with the Receive waveform segments. By repeatedly presenting segments of the Transmit reference waveform for the comparison, a priori knowledge of the approximate radar target range (distance) is obviated. Yet another unique feature is the filters used to spectrally separate the multiple tones of the Transmit reference and Receive waveforms for their comparison by RF mixing. This comparison preferably occurs on a tone-by-tone basis or with small subsets of tones. These filters preferably have a periodic frequency spectrum. By using two sets of such filters with each set having a different spectral period, fewer filters are needed to accommodate the large number of distinct frequencies that must be separated. Also, a novel configuration of tapped delay lines and RF switches are preferably used to temporally align the Receive segments with the repeated Transmit-reference.

BRIEF DESCRIPTION OF THE DRAWINGS

FIG. 15A-15C illustrate the generation of the frequency-modulated tones by the apparatus of FIG. 15;

FIGS. 17A-17D depict frequency spectra produced at various locations in the waveform generator;

DETAILED DESCRIPTION

This invention relates to a unique approach in the generation of rapidly frequency hopped or dithered, or frequency modulated multi-tone RF comb lines on a lightwave carrier using coherent optical heterodyning in order to make the signal transmitted on these carriers difficult to detect. The concept of optical heterodyning was briefly discussed above, to provide background information. Two embodiments for generating a frequency translatable comb signal are described with reference to FIGS. 3-6. Then, several embodiments for producing a frequency-hopped waveform are described with reference to FIGS. 7 and 8. Finally, modifications for improved stability and tone uniformity are then discussed (with reference to FIGS. 9-14) according to embodiments for generating the frequency translatable comb signal.

Figure 1:
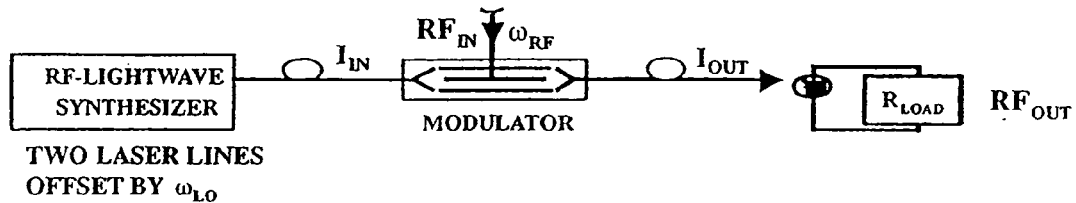
FIG. 1 is an illustration of a prior art frequency conversion technique performed with a RF-lightwave synthesizer.
Figure 2A:
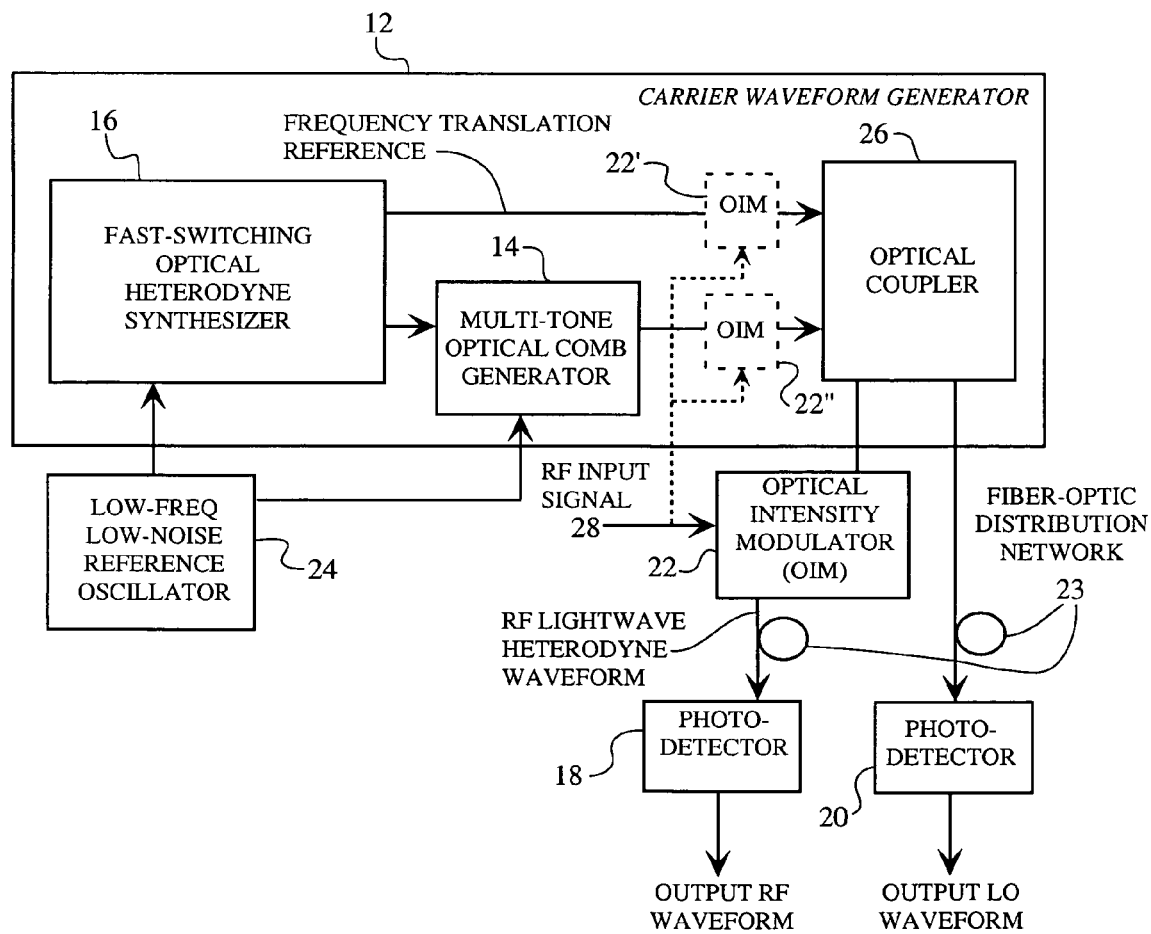
FIG. 2A is a block diagram of an agile waveform generator in accordance with an embodiment of the present invention.

A block diagram of an agile waveform generator 12 according to an embodiment of the present invention is shown in FIG. 2A. The embodiment depicted in FIG. 2A may be particularly useful in a frequency hopped environment, although it may also be adapted for use in a frequency-modulated environment. The waveform generator 12 has two main portions 14, 16 that will be described in greater detail with reference to FIGS. 3 and 6-14. The first main portion is a type of photonic oscillator, namely, a multi-tone optical comb generator 14 that generates a series of low-phase-noise RF comb lines on an optical carrier. The second main portion is a fast-switching optical heterodyne synthesizer 16 , which includes two phase-locked lasers 70, 72 (shown in FIGS. 7 and 8), the first laser 70 feeding the optical comb generator 14. The second laser 72 is a rapidly wavelength-tunable single tone laser whose output light, a frequency translation reference, is heterodyned with the optical output of the photonic oscillator 14 in a photodetector 18 to generate the frequency hopped RF comb lines (sometimes element 14 herein is referred to as an oscillator and sometimes as a generator—this is due to the fact that "oscillator" 14 "generates" the RF comb). Local oscillator (LO) selector 80 (shown in FIG. 7) controls the frequency hopping. The agile wavelength offset of the two lasers determines the translation in frequency of the resulting multi-tone RF comb. Furthermore, an optical phase modulator (not shown) can also be inserted in the optical path of the wavelength tunable laser, which can result in further dithering of the multi-tone RF comb in the frequency domain. This effect, combined with the frequency hopping mechanism described above, renders the modulated RF transmit signal very difficult to intercept.

An optical coupler 26 combines the output of the comb generator 14 with the output of the wavelength tunable laser in synthesizer 16 . The combined output can be modulated by the RF transmit signal 28 using an optical intensity modulator 22 as shown in FIG. 2. In FIG. 2A, the optical intensity modulator 22 is shown downstream of the optical coupler 26 . Alternatively, the optical intensity modulator can be placed between generator 14 and coupler 26 as shown by block 22' or between the synthesizer 16 and the coupler 26 as shown by the block 22". Moreover, the output of coupler 26 can be further modulated by additional pulsed or polyphased codes (or the transmit signal can be modulated by such codes) to reduce the probability of detection (intercept) even more. The pulsed or polyphased codes can be applied at the RF signal input 28 or at a separate optical intensity modulator in series with modulator 22.

When the modulator 22 is downstream of the optical coupler 26 , a second output of the optical coupler 26 can be used to generate a RF comb local-oscillator reference signal from a photodetector 20, which can be conveniently employed in a coherent receiver. An alternate embodiment is to have the reference signal comprise both the RF comb and any additional codes by modulating the output of the comb generator 14 before the modulated output is combined with the frequency translation reference in coupler 26 by moving the optical intensity modulator upstream of coupler 26 as shown by blocks 22' or 22" in FIG. 2A.

The low frequency, low noise reference oscillator 24 provides a timing reference signal to the synthesizer 16 and to the multi-tone oscillator 14.

The modulated frequency hopped RF comb lines available at the output of photodetector 18 are applied to a suitable RF amplifier (not shown) and thence to an antenna (also not shown) for transmission as a communication signal or as a radar pulse, as appropriate to the application in which the present invention is utilized.

Photodetector 18 can be implemented as a portion of an RF amplifier and therefore the RF Lightwave Heterodyne Waveform available from, for example, modulator 22, can be supplied as an optical signal to the RF amplifier. One possible embodiment for an RF amplifier is disclosed in U.S. provisional patent application entitled "Remotely Locatable RF Power Amplification System" bearing Ser. No. 60/332,368 and filed Nov. 15, 2001, and its corresponding non-provisional application bearing Ser. No. 10/116,854 filed on Apr. 5, 2002. The RF Lightwave Heterodyne Waveform could be applied as the sole input to fiber 113 depicted in FIG. 2 of that application and then the function of photodetector 18 would be provided by detectors 302 shown in FIG. 2 of that application. If the output of photodetector 18 is utilized as an input to the RF amplifier, as disclosed in the U.S. patent application entitled "Remotely Locatable RF Power Amplification System" noted above, then the output of photodetector 18 could be applied as an input to modulator 106 shown in FIG. 2 of that application.

Figure 2B:
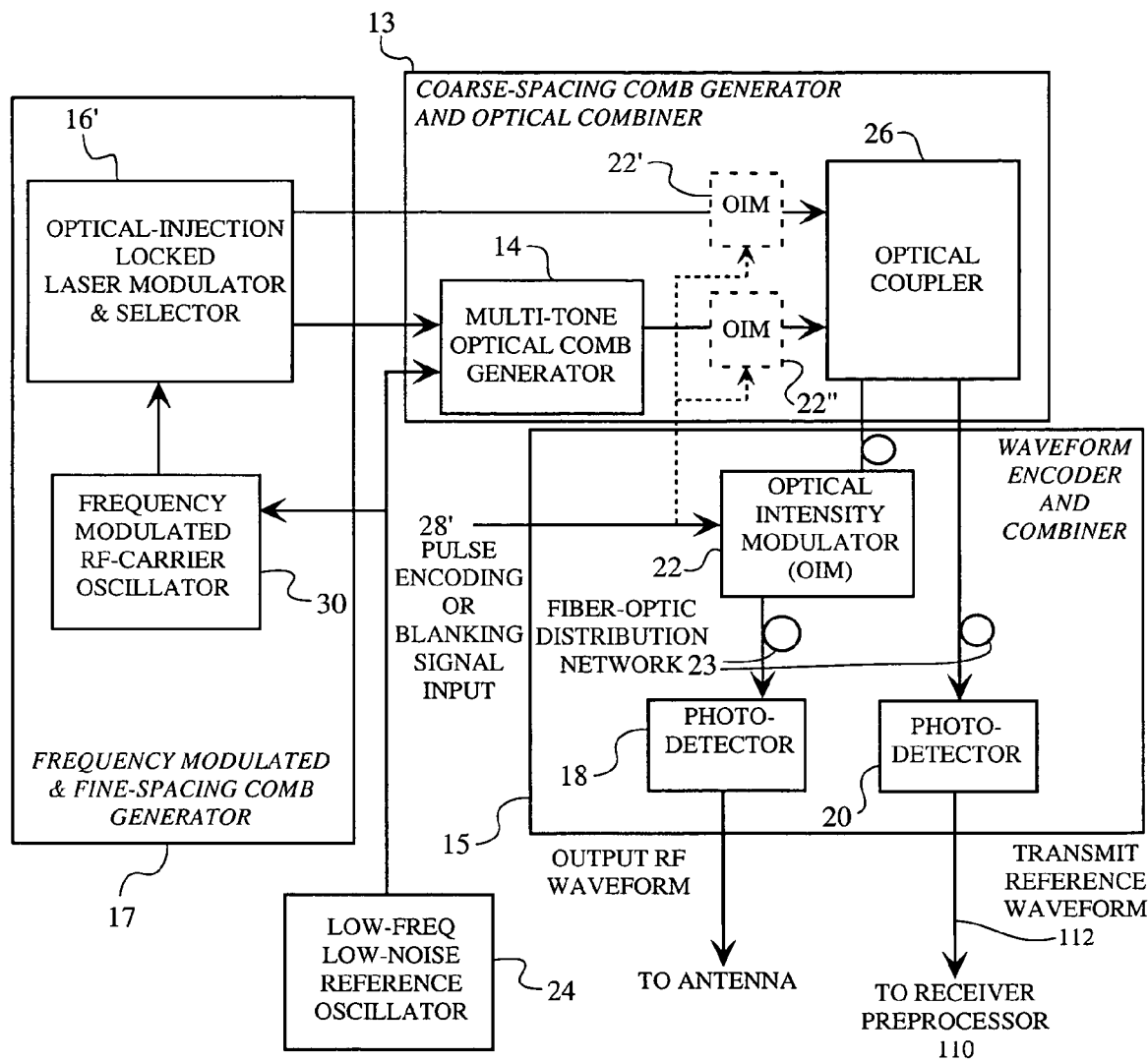
FIG. 2B is a block diagram of a frequency modulated waveform generator in accordance with an embodiment of the present invention.

Embodiments of the present invention also relate to the generation of frequency modulated multi-tone RF comb lines using coherent optical heterodyning in order to, for example, make the signal transmitted on such carriers difficult to detect. FIG. 2B shows a block diagram of a frequency modulated spread waveform generator according to an embodiment of the present invention that may be particularly useful in a frequency-modulated environment. Frequency modulation of the RF comb lines can further increase the resistance of the transmitted signals being subject to detection and/or can improve range detection capabilities of radar signals.

The waveform generator depicted in FIG. 2B preferably consists of three main segments 13, 15, 17. The first segment 17 generates a lightwave carrier and a frequency-modulated RF-lightwave signal for the second segment 13. If the frequency modulation is periodic, the Fourier spectral components of the modulated signal comprise a multi-tone comb. The tone spacing of this comb may be quite fine, typically in the range of 0.1-100 MHz. The second segment 13 generates a set of low-phase-noise RF comb lines on the lightwave carrier, supplied to it by the first segment 17. The second segment 13 also places both RF-lightwave signals (i. e., the resultant RF-lightwave heterodyne waveform) onto the same optical fiber. The third segment 15 provides a way to apply an electrical encoding or blanking waveform, such as a radar pulse code or a communications signal, onto the RF-lightwave waveform. The third segment 15 also generates both a RF-output Transmit waveform and a RF reference waveform by optical heterodyning the two RF-lightwave signals at photodetectors 18, 20. The output Transmit waveform may be the encoded LPI waveform that is to be transmitted from the antenna of a sensor system. The reference carrier waveform can be an unencoded wideband RF comb, which can be used by a matched or coherent receiver of the sensor system. The reference carrier waveform may also be encoded by the same optical intensity modulator as the Transmit waveform or with a different modulator.

The second segment 13, that is, the coarse-spacing comb generator and optical combiner as shown in FIG. 2B, has a multi-tone optical comb generator 14. The optical comb generator 14 depicted in FIG. 2B may be similar to the optical comb generator 14 depicted in FIG. 2A. As similarly described above, the optical comb generator 14 generates a series of low-phase noise RF comb lines on a optical carrier. The optical comb generator is described in additional detail below.

Figure 9A:
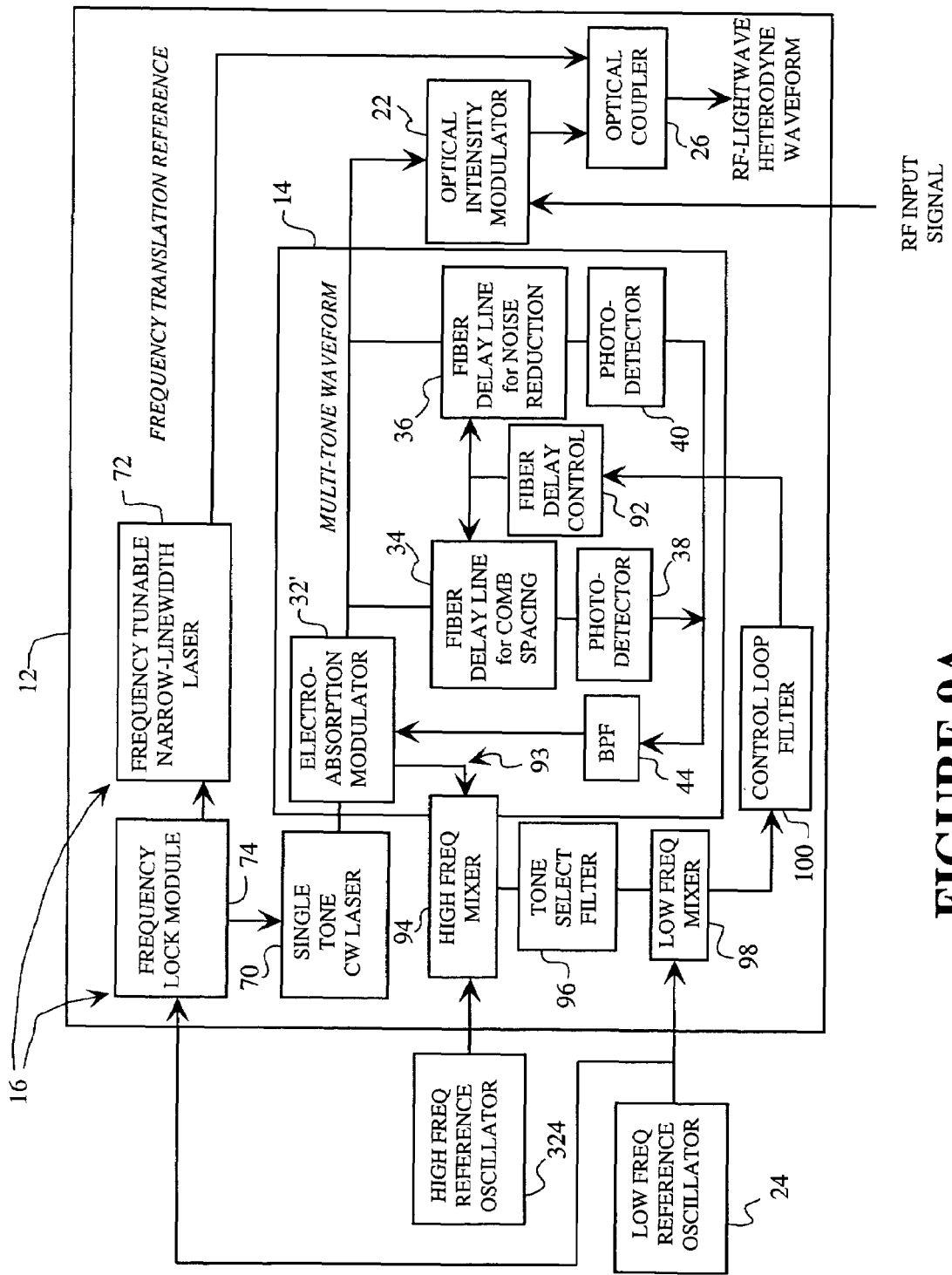
FIG. 9A is a block diagram of the multi-loop, multi-tone photonic oscillator and a block diagram of the fast-switching optical heterodyned synthesizer consisting of a rapidly wavelength tunable and a fixed wavelength laser, the photonic oscillator having a fiber delay control apparatus and a feedback loop to control the fiber delay.
Figure 9B:
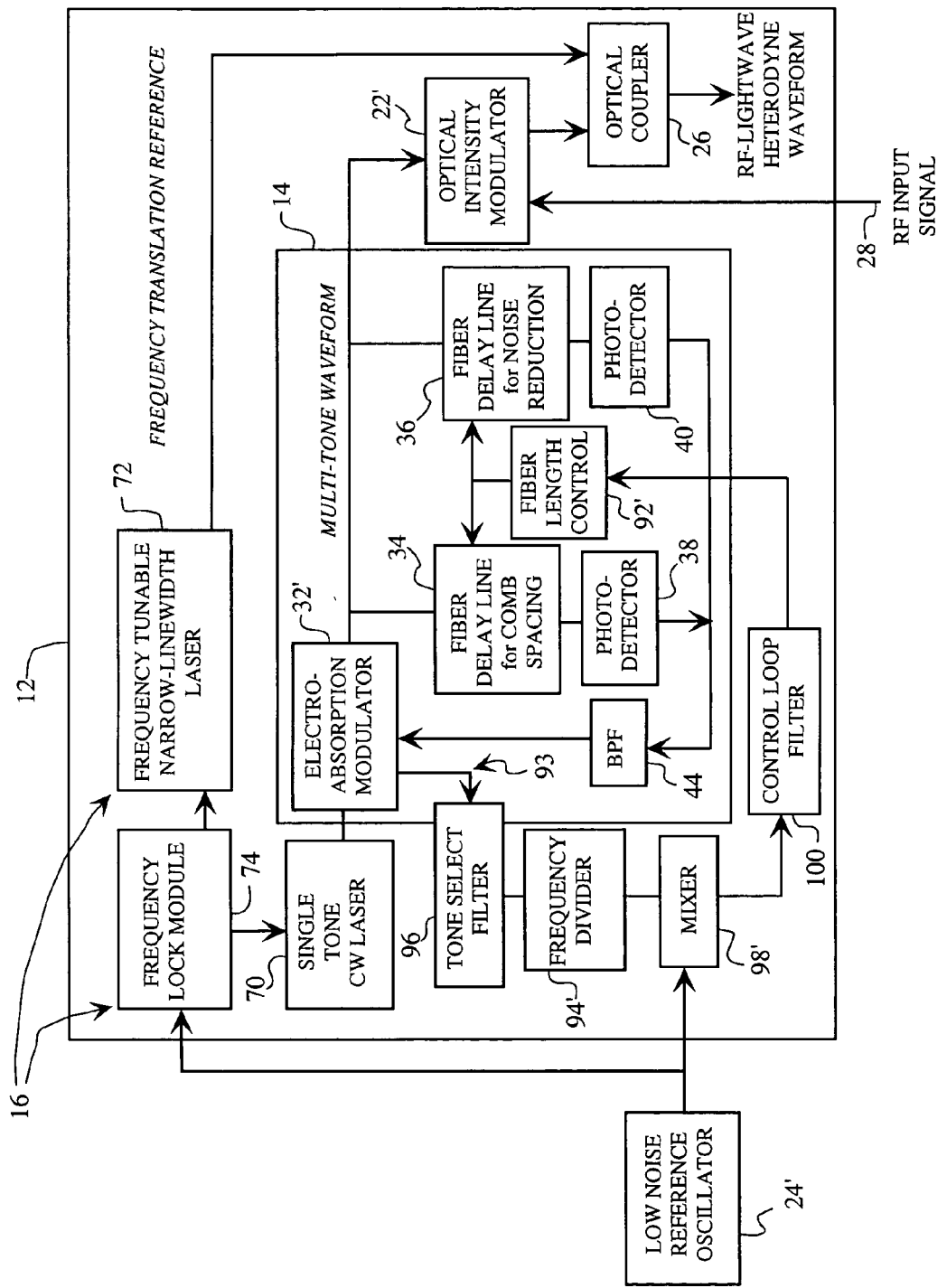
FIG. 9B is a block diagram of the multi-loop, multi-tone photonic oscillator and a block diagram of frequency modulated optical heterodyned synthesizer consisting of a rapidly wavelength tunable and a fixed wavelength laser, the photonic oscillator having a fiber delay control apparatus and a feedback loop to control the fiber delay.
Figure 10A:
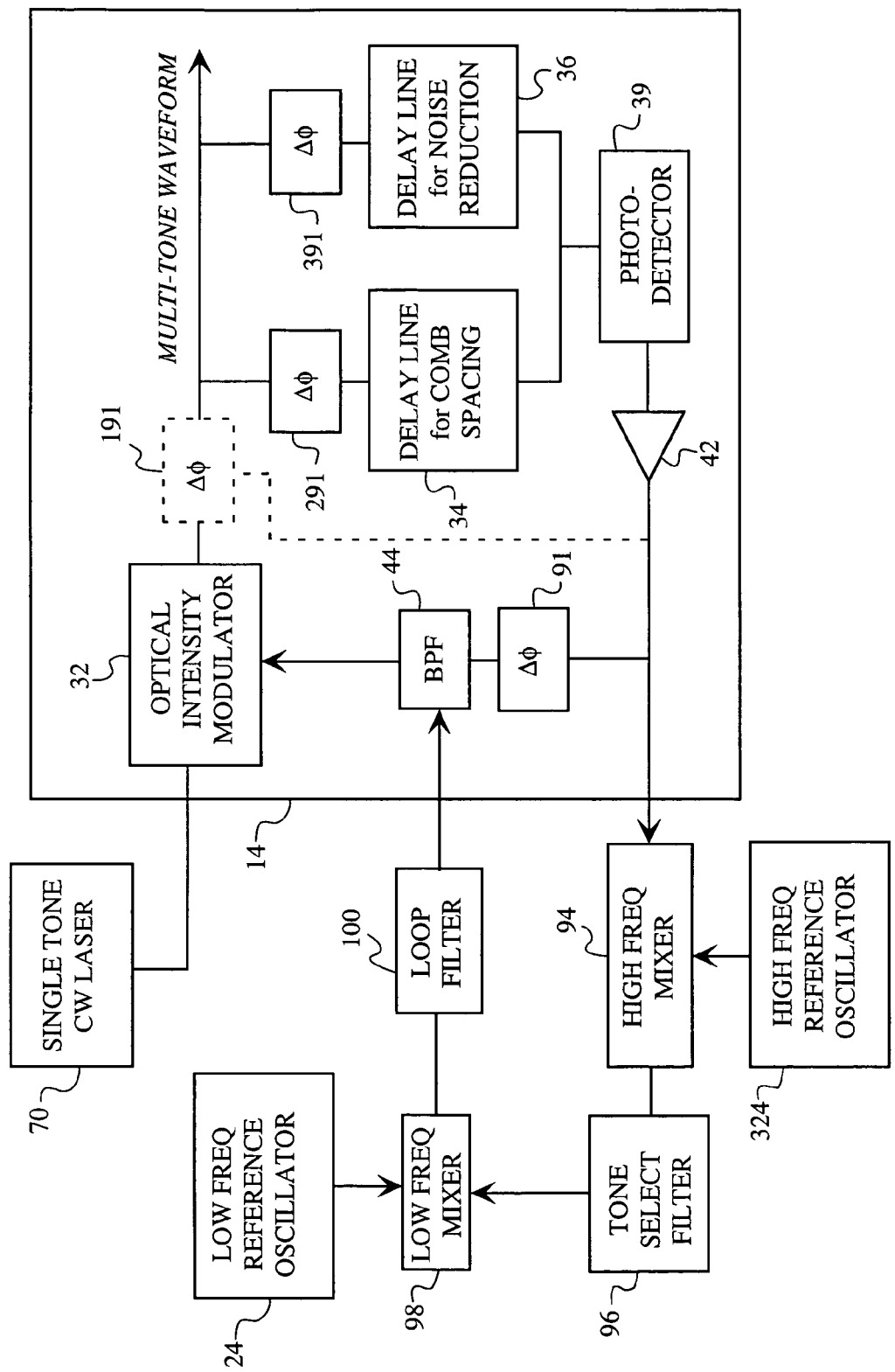
FIG. 10A is similar to FIG. 9A, but instead of having a fiber length control apparatus, it utilizes phase control of the loop to compensate for environment changes in the lengths of the fibers in the multi-loop, multi-tone photonic oscillator.
Figure 10B:
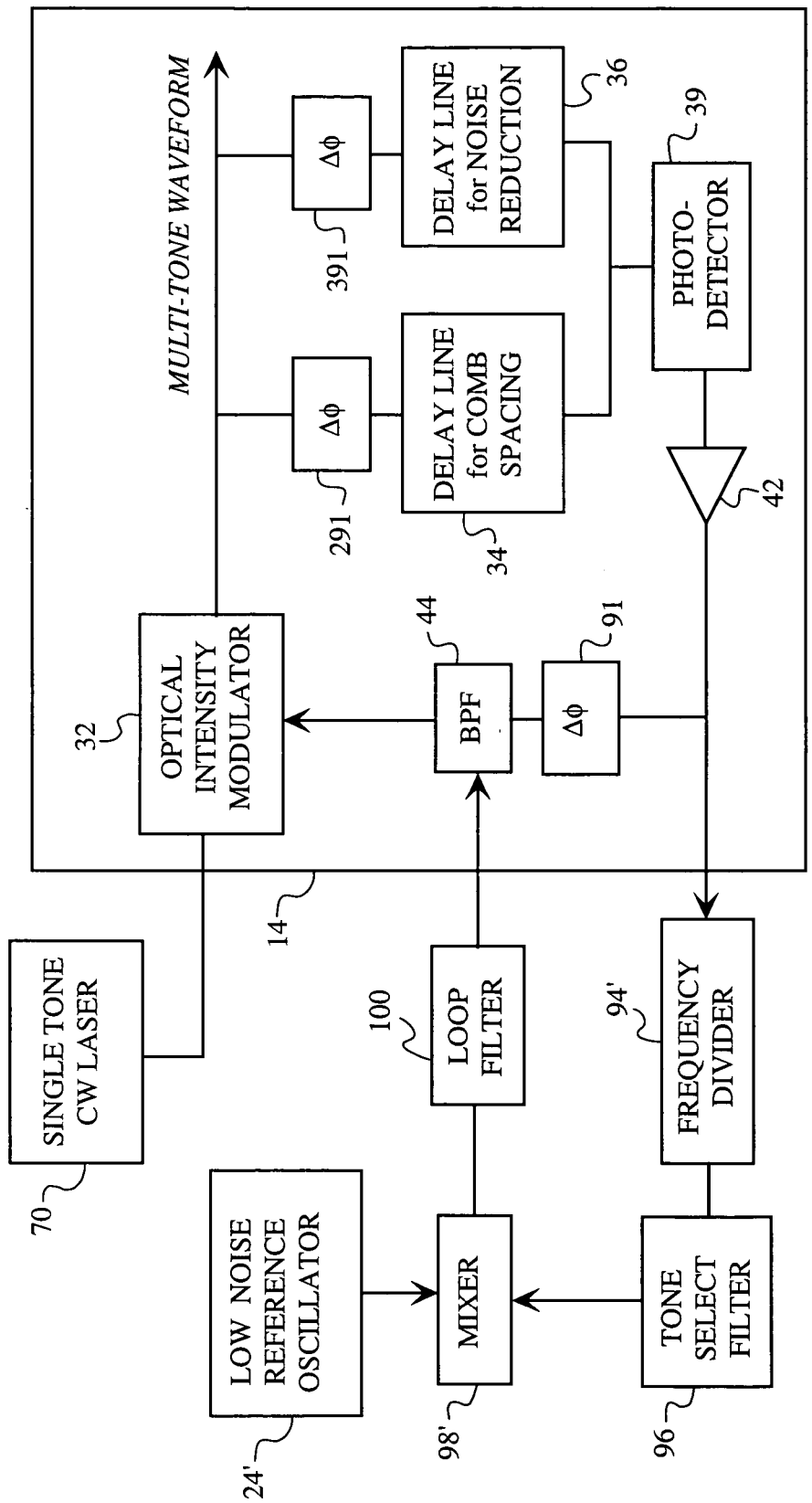
FIG. 10B is similar to FIG. 9B, but instead of having a fiber length control apparatus, it utilizes phase control of the loop to compensate for environment changes in the lengths of the fibers in the multi-loop, multi-tone photonic oscillator.
Figure 12:
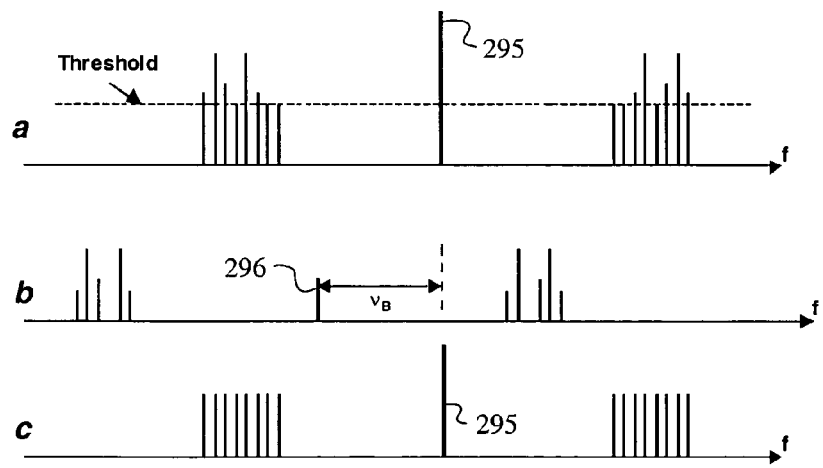
FIG. 12 shows the spectrum of the optical signal at various points within the oscillator shown in FIG. 11.

The first segment 17, that is, the frequency modulated and fine-spaced comb generator as shown in FIG. 2B, has an optical heterodyne synthesizer 16', which includes two phase-locked lasers 70, 72 (shown in FIGS. 9B, 10B and 12). As shown in FIGS. 9B, 10B and 12, the first laser 70 feeds the optical comb generator 14. The second laser 72 is preferably a rapidly wavelength-tunable single tone laser having its light output, a frequency translation reference, heterodyned with the optical output of the comb generator 14 in a photodetector 18 to generate frequency modulated RF comb lines. Please note that the comb generator 14 may be referred to herein as an oscillator or as a generator, since the generation of the comb lines involves the oscillation at multiple frequencies. As shown in FIG. 2B, an RF oscillator 30 may control the frequency modulation.

In FIG. 2B, the optical coupler 26 combines the output of the comb generator 14 with the output of the wavelength tunable laser from synthesizer 16'. The combined output can be modulated by a RF transmit signal through input 28 using an optical intensity modulator 22. In FIG. 2B, the optical intensity modulator 22 is shown downstream of the optical coupler 26. Alternatively, the optical intensity modulator can be placed between generator 14 and coupler 26 as shown by block 22' or between the synthesizer 16 and the coupler 26 as shown by the block 22". Moreover, the output of coupler 26 can be further modulated by additional pulsed or polyphased codes (or the transmit signal can be modulated by such codes) to reduce the probability of detection (intercept) even more. The pulsed or polyphased codes can be applied at the RF signal input 28 or at a separate optical intensity modulator in series with modulator 22. A second output of the optical coupler 26 may be used to generate a transmit reference signal from the photodetector 20, which may be employed in a coherent receiver.

The low frequency low noise reference oscillator 24 provides a timing reference signal to the frequency modulated oscillator 30 and to the multi-tone oscillator 14.

With the generator depicted in FIG. 2B, the amplitude and frequency modulated RF comb lines available at the output of the photodetector 18 may be applied to a suitable RF amplifier (not shown) and then to an antenna (also not shown) for transmission as a communication signal or as a radar pulse. As similarly discussed above, the photodetector 18 depicted in FIG. 2B may be implemented as a portion of the RF amplifier and the heterodyne waveform available from, for example, the modulator 22, can be supplied as an optical signal to the RF amplifier. See U.S. applications Ser. Nos. 60/332,368 and 10/116,854, discussed above, for some possible RF amplifier embodiments.

Figure 3:
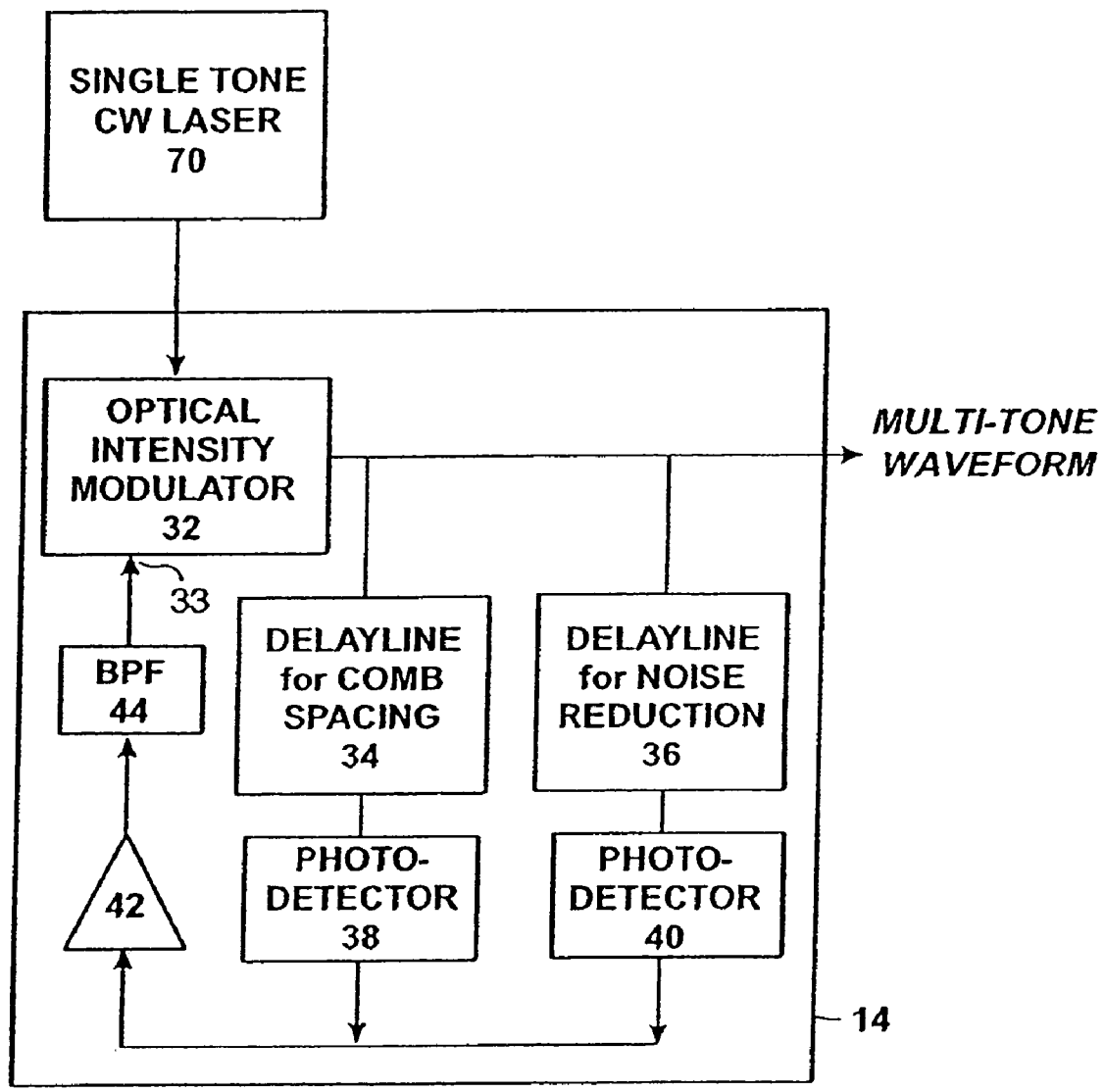
FIG. 3 is a block diagram of the multi-loop, multi-tone photonic oscillator.

The RF-lightwave multi-tone comb generator 14 of the apparatus depicted in either FIG. 2A or FIG. 2B can be implemented using a variety of techniques. An embodiment of the waveform generator is a multi-loop, multi-tone photonic oscillator 14, a block diagram of which is shown in FIG. 3 (additional block diagrams, including additional features, will be discussed later with reference to FIGS. 6, and 9A, 9B, 10A, 10B, and 11-14). The multi-loop, multi-tone photonic oscillator 14 preferably includes at least two loops that preferably have a common portion. An optical modulator 32 is preferably employed in the common portion while delay paths 34 and 36 and photodetectors 38 and 40 are employed in respective first and second loops. A low-noise electrical amplifier 42 and a RF bandpass filter 44 are preferably also deployed in the common portion of the loops. The laser light is preferably provided by a laser 70, which supplies the optical power for the oscillator 14, the laser light being modulated by a RF signal at the electrical input 33 of the modulator 32. The modulated lightwave is then split into two branches, one branch connected to a first optical delay path 34, and the other branch connected to a second optical delay path 36. Preferably, the optical delay in the first optical delay path 34 is less than the optical delay of the second optical delay path 36. While FIG. 3 shows the optical delays being provided by fiber delay lines 34, 36, other methods and apparatus for providing the requisite optical delays may be used in accordance with other embodiments of the present invention. The optical signals in the two lightwave paths are sensed by two photodetectors 38 and 40 whose electrical outputs are combined and, following amplification and bandpass filtering, are fed back to the modulator 32, as shown in FIG. 3. The bandpass filter 44 sets the bandwidth of the generated RF multi-tone comb spectrum. The two photodetectors 38, 40 may be replaced by a single photodetector (see, for example, detector 39 in FIG. 10).

The operating principle of this multi-tone oscillator 14 is as follows. Random electrical noise generated in the feedback loops modulates the laser light, which after propagating through the two optical delay paths having the fiber delay lines 34,36 and being photodetected is regeneratively fed back to the modulator 32. This positive feedback results in oscillations if the open loop gain is greater than one. If need be, the amplifier 42 may be provided in the loop common portion to add gain. Gain can alternatively be added in the optical loops by using a pump laser (of the type shown, for example, in FIG. 6—see element 29) and making a portion of the fiber 27 (also shown in FIG. 6) consist of optically amplifying material such as erbium-doped glass. In the case of a dual-loop photonic oscillator, potential oscillation modes exist at frequency intervals that are an integer multiple of the inverse of the delay times of the two loops ($\tau_S$ and $\tau_L$), where $\tau_s$ is the delay time of the shorter loop and $\tau_L$ is the longer loop's delay time. However, oscillation will only occur at frequencies where the modes resulting from both delay loops overlap, especially if the sum of the open loop gains of both feedback loops is greater than one and the open loop gains of each feedback loop is less than one. Therefore, oscillations will occur with a minimum mode spacing being at the frequency interval determined by the shorter loop ($\Delta f = k/\tau_S$). Hence, the first fiber delay line 34 may be considered as providing the spacing of lines within the optical comb. On the other hand, the oscillator phase noise $S(f')$ decreases quadratically with the optical delay time in the longer loop: $S(f') = \rho/[(2\pi)^2(\tau_L f')^2]$, where $\rho$ is the input noise-to-signal ratio and $f'$ is the offset frequency. Therefore, the second fiber delay line 36 may be considered as providing for noise reduction. Combining these two effects results in a multi-tone, multi-loop photonic oscillator in which the tone spacing and phase noise can be independently controlled.

Figure 4:
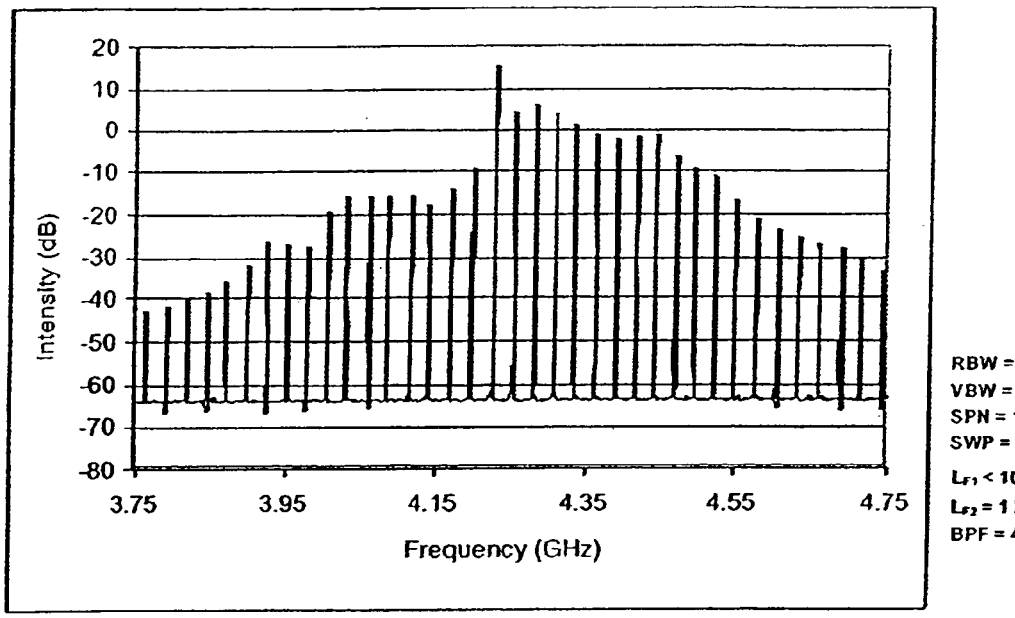
FIG. 4 depicts the measured RF spectrum of a multi-loop, multi-tone photonic oscillator.
Figure 5:
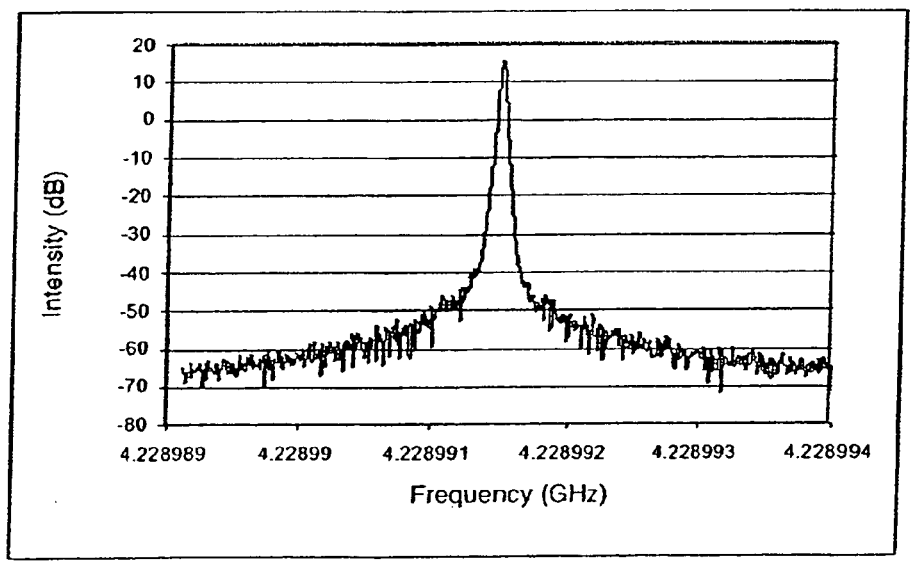
FIG. 5 is a detailed spectrum of one of the RF tones of a dual-loop (1 km long loop, 8 m short loop) multi-tone photonic oscillator indicating a very high spectral purity.

The measured RF spectrum of a dual-loop, multi-tone photonic oscillator spanning a frequency range of 1 GHz is shown in FIG. 4. This oscillator has two fiber optic delay loops, with a shorter loop of about 8 m (or longer) and a longer loop of about 1 km (or longer). When the length of the shorter loop is 8 m, the tone spacing is about 26 MHz, indicating a delay time of 38 nanoseconds. The detailed RF spectrum of one of the oscillation tones in the dual-loop multi-tone photonic oscillator is shown in FIG. 5, indicating an excellent spectral purity. The frequency span is 5 KHz. The length, and, therefore, the delay, of the longer loop is preferably at least 40 or more times longer than the length, i. e., the delay, of the shorter loop.

Figure 6:
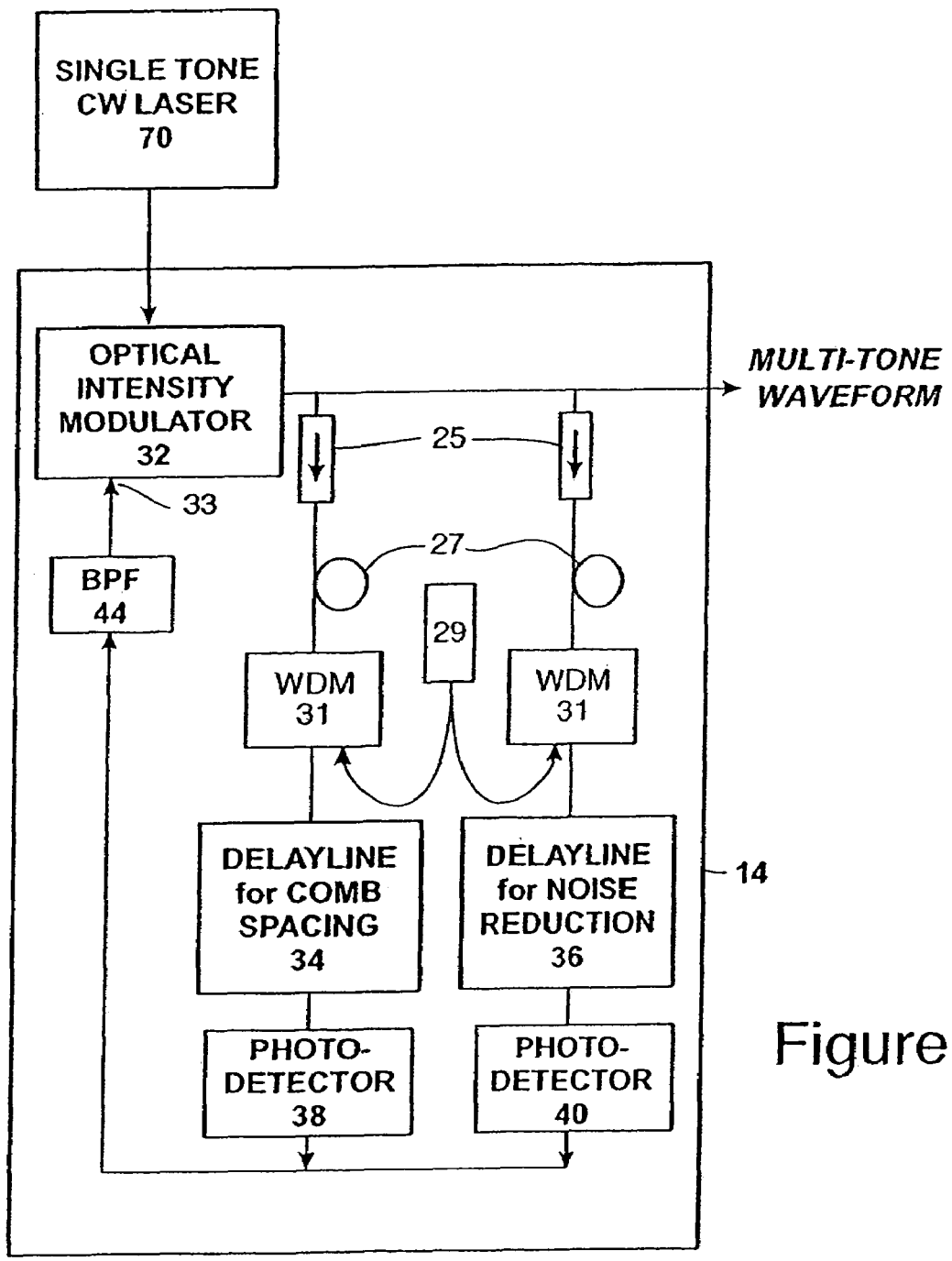
FIG. 6 is a block diagram of the multi-loop, multi-tone photonic oscillator with optically amplified loops.

In another embodiment, the multi-tone photonic oscillator 14 can be implemented using optical amplifiers, as shown in FIG. 6, instead of electronic amplifiers, as previously discussed with reference to FIG. 3. In this embodiment, each loop preferably includes an isolator 25, an Er-doped or an Yb/Er-doped fiber segment 27, and a wavelength division multiplexer (WDM) 31. Each doped fiber segment 27 is preferably pumped by a pump laser 29, although the pump laser 29 and the associated Er-doped or Yb/Er-doped segment 27 could be employed in only one of the loops, if desired. The isolators 25 keep the light flowing in the correct direction (clockwise in FIG. 6) in the loops and also keep the light from the pump laser 29 from interfering with the operation of the modulator 32. The WDMs 31 couple the light from the pump laser 29 into the loops and keep that light from interfering with the function of the photodetectors 38, 40. The two photodetectors 38, 40 may be replaced with a single photodetector 39 as shown in FIG. 10 if desired, and two pump lasers 29 could be used (one for each loop), if desired.

Alternative embodiments of a multi-tone photonic oscillator which provide for a more level output across a comb, such as the comb depicted in FIG. 4, are described below in reference to FIGS. 11-14.

Figure 7:
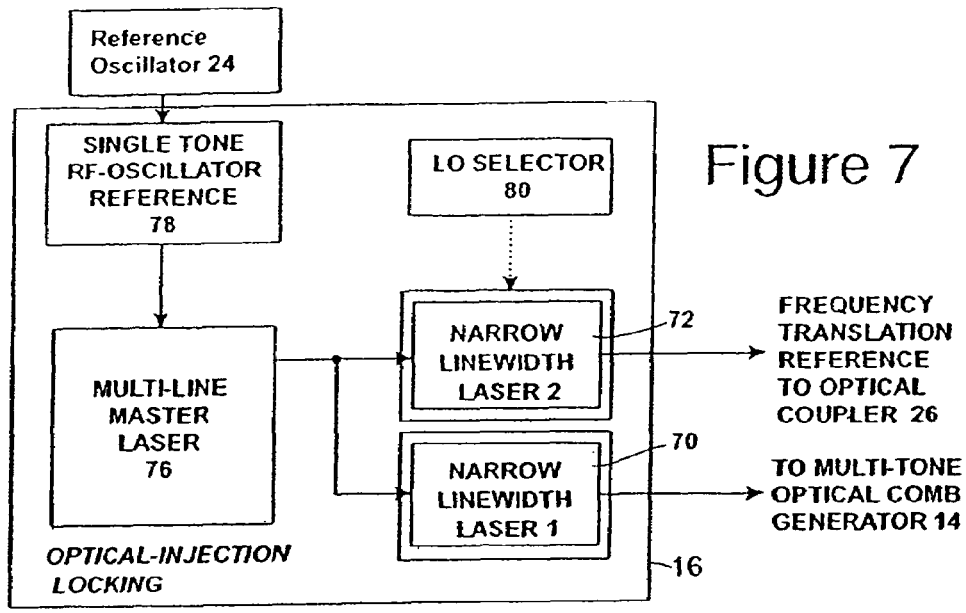
FIG. 7 is an illustration of a fast-switching optical heterodyne synthesizer based on optical injection.
Figure 8:
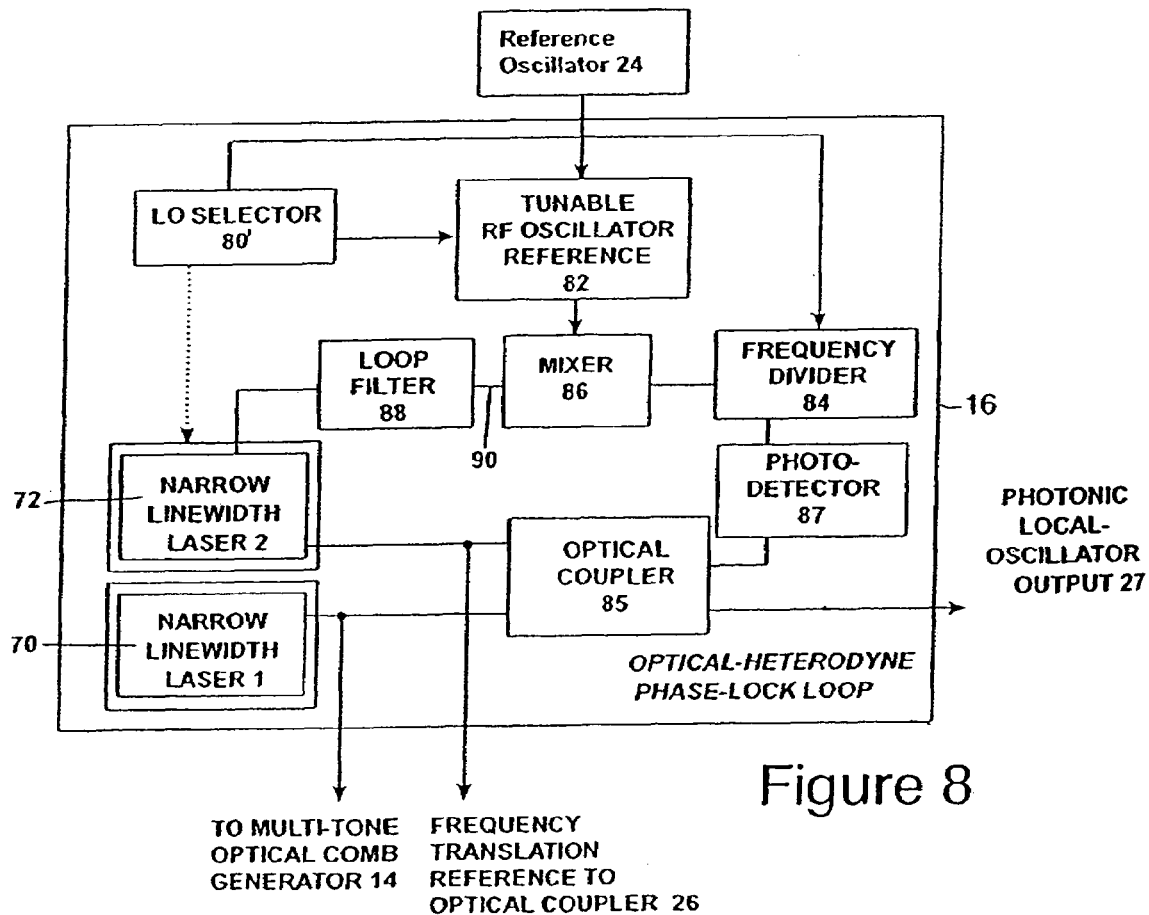
FIG. 8 is an illustration of a fast-switching heterodyne synthesizer based on a phase locked loop.

Several techniques can be used to realize the fast-switching optical heterodyne synthesizer 16. See FIGS. 7 and 8 for exemplary embodiments. In the embodiments of FIGS. 7 and 8, the synthesizer 16 includes the two previously mentioned lasers 70 and 72. These lasers are phase-locked. The first laser 70 is a fixed wavelength laser and the second laser 72 is a rapidly tunable laser. This phase locking can be accomplished using several known techniques. One of these techniques, and the preferred technique, is illustrated in FIG. 7. This technique involves optical injection locking of the two lasers 70 and 72 (the slave lasers) to different lines of a multiline master laser 76. These lines can be: (1) different modes of a mode-locked master laser, (2) modulation sidebands of a frequency modulated or amplitude modulated master laser, or (3) different phase-locked modes of a multiline laser (see the comb generator disclosed by prior art references 1 and 3).

A highly stable and low phase-noise, single tone RF reference oscillator 78 may be used to externally lock the mode locked laser 76 (if using alternative 1 mentioned above), frequency or amplitude modulate the master laser 76 (if using alternative 2 mentioned above), or phase modulate the multiline laser 76 (if using alternative 3 mentioned above). The RF reference oscillator 78 may be further stabilized or synchronized by an additional reference oscillator 24 as discussed with reference to FIG. 2.

The optical output of the multi-tone comb generator 14, which is fed by the fixed wavelength laser 70, is an optical comb containing the laser wavelength modulated by the RF comb lines Combining this optical comb with the rapidly tunable wavelength of the second laser 72 in photodetectors 18 or 20 results in a set of RF comb lines which can be rapidly switched (hopped) in the frequency domain. The frequency-hopping interval is determined by the wavelength interval over which the second laser 72 is stepped. With the optical injection locking approaches described above (see the embodiment of FIG. 7), this interval is determined by the spacing between adjacent modes or sidebands of the multiline master laser 76. If the mode spacing for the multiline master laser 76 is 5 GHz, and the bandwidth of the comb is 5 GHz, the center frequency of the comb can be hopped rapidly between 5 GHz and 10 GHz and 15 GHz, and so on, in any order. Since these two lasers 70 and 72 are phase-locked, as described above, the resulting frequency-switchable heterodyned RF tones will have good spectral purity and low phase noise. Note should be made of the fact that the frequency-hopping interval can be smaller than the bandwidth of the comb.

Another technique for phase locking laser 70 and 72 involves a phased-locked loop, see FIG. 8. The phased-lock loop embodiment of FIG. 8 takes the heterodyned output of the two lasers 70 and 72 and compares that output with an external RF reference 82 in a RF phase detector to produce an error signal 90 at the output of a RF phase detector or mixer 86 for correcting the wavelengths of the lasers 70, 72. The outputs of the two lasers 70, 72 are coupled by coupler 85 and detected by photodetector 87 where the heterodyned electrical signal is produced. The output of detector 87 is preferably frequency-divided down by a frequency divider 84 and the output of the frequency divider 84 is applied to the mixer 86. With this approach, the wavelength difference between the two phase-locked lasers 70, 72 can be varied in steps equal to the steps of the frequency divider 84. If continuous tuning is desired then the RF reference 82 should be continuously tunable. A variation of the phase-locked loop approach involves using wavelength intervals that are larger than the frequency of the RF reference. The frequency divider 84 divides the heterodyne output of the two lasers to a lower frequency that can be compared with the RF reference 82 by mixer 86, as illustrated in FIG. 8. The frequency-hopping interval would then be equal to the divider ratio multiplied by the minimum step of the tunable RF reference 82. The embodiment of FIG. 8 permits the hopping to be very fine, so fine that the signal seems essentially continuous. The output 27 of the coupler 85 has hopping information useful to an associated receiver when used in a radar application, for example.

These four alternatives (the three alternatives discussed with reference to FIG. 7 and the alternative of FIG. 8) have different advantages and disadvantages. Generally speaking, alternative (1) (which is associated with FIG. 7) generates very clean tones that are easy to switch between. Alternative (2) yields fewer tones. Alternative (3) yields a large number of tones, but they are not clean. Alternative (4) requires lasers that have either a very narrow linewidth or a phase locked loop with a very short loop delay time.

The LO selector 80 shown in FIG. 7 adjusts the free-running frequency or wavelength of laser 72 to match the desired line output from multiline master laser 76. This is accomplished by setting the temperature and drive current of laser 72. The LO selector 80' shown in FIG. 8 sets the temperature of laser 72 to obtain a desired free-running frequency or wavelength for that laser. The actual laser frequency or wavelength is fine tuned by controlling its drive current by means of the phase lock loop. LO selector 80' also selects the frequency of the tunable oscillator 82 as well as the divide ratio of the frequency divider 84.

FIG. 9A presents a block diagram of the multi-loop, multi-tone photonic oscillator 14, the photonic oscillator having a fiber delay control apparatus 92 and a feedback loop to control the delays of fiber delay lines 34 and 36, within an agile waveform generator 12 according to another embodiment of the present invention. The fiber delay lines 34 and 36 are apt to be sufficiently long that as they change length or refractive index in response to changes in temperature of their environment, the change in temperature will adversely affect the phase of the oscillator 14. Thus, some means for compensating or controlling the tendency of the fiber delay lines 34 and 36 to change the delays they impose in response to changes of environmental temperature is desirable. In FIG. 9A, fiber delay control apparatus 92 may be a heating and/or cooling apparatus for heating and/or cooling at least the fiber delay lines 34 and 36 in order to control their lengths and/or refractive indices or fiber delay control apparatus 92 may physically stretch or compress the fiber delay lines 34 and 36 in order to control their lengths or refractive indices, respectively. For example, fiber delay control apparatus 92 can comprise piezoelectric fiber stretchers.

A feedback circuit preferably comprising a high frequency mixer 94, a tone select filter 96, a low frequency mixer 98 and a loop filter 100 is utilized to control apparatus 92. The high frequency mixer 94 is used in combination with a single frequency tone supplied by a high frequency reference oscillator 324 to shift the frequencies of the comb to a lower range that can be accommodated by tone select filter 96. The tone select filter 96 selects one of the generated and frequency reduced tones for comparison against a reference tone available from, for example, the low frequency reference oscillator 24 by low frequency mixer 98. The low frequency mixer 98 functions as a frequency/phase discriminator comparing the tone selected by filter 96 with the signal supplied by the low frequency reference oscillator 24. The output of mixer 98 is filtered by an appropriate loop filter 100 and then applied as a control signal to fiber length control apparatus 92. In that way, the delays of the fiber delay lines 34 and 36 are adjusted in response to changes in one of the frequencies generated by the photonic oscillator 14.

The optical intensity modulator of the embodiment shown in FIG. 9A is preferably implemented as an electroabsorption modulator 32'. An electroabsorption modulator 32' not only modulates the amplitude of the lightwave carrier supplied by laser 70 but it also produces a photocurrent 93 that is fed to the high frequency mixer 94 in the feedback circuit. Alternatively, the feedback from the loops may be obtained at the outputs of the photodetectors 38, 40. In another embodiment, the two photodetectors 38, 40 may be replaced by a single photodetector 39, similar to the configuration shown in FIG. 10A.

In the agile waveform generator 12 shown in FIG. 9A, the frequency lock module 74 provides for phase locking the CW laser 70 used for comb generation to the frequency tunable narrow linewidth laser 72 used for the frequency translation reference. The frequency lock module 74 may comprise the apparatus discussed above in reference to FIG. 7 or other methods or apparatus that provide that the outputs of the two lasers 70, 72 are phase locked. Not shown in FIG. 9A is the local oscillator selector used to set the output frequency of the narrow linewidth laser 72.

FIG. 9A also shows that the optical intensity modulator 22 receiving the RF input signal 28 is disposed upstream of the optical coupler 26 and receives the output from the photonic oscillator 14. Alternatively, the optical intensity modulator 22 may be disposed upstream of the optical coupler 26 and receive the output of the narrow linewidth laser 72. In either case, the output of the optical coupler is an optical signal that contains the RF-lightwave comb from the photonic oscillator and the narrow linewidth output from the narrow linewidth laser 72. As discussed above, the provision of the output from the optical coupler to a suitable photodetector would then provide a modulated frequency hopped RF comb output. Of course, as discussed above, the optical intensity modulator 22 may be disposed at the output of the optical coupler 26. The comb generator 14 shown in FIG. 10A is similar to the comb generator 14 shown in FIG. 9A, but instead of having a fiber delay control apparatus 92, it utilizes phase control of the loop common portion to compensate for environmental changes in the fiber delay lines 34, 36 in the multi-loop, multi-tone photonic oscillator 14. A RF phase shifter 91 is placed in the loop common portion of the multi-tone comb generator 14 and is utilized in lieu of the fiber delay control apparatus 92 to compensate for changes in the fiber delay lines 34 and 36. A feedback circuit similar to that of FIG. 9A is used to control the phase shifter 91. This feedback circuit taps off a portion of the photodetected and amplified multi-tone waveform to determine its departure from the frequency and phase of the reference oscillator 24. Alternatively, an optical phase shifter or a variable delay line 591 (shown as the dashed box 591 in FIG. 10A) can be used in the loop common portion instead of RF phase shifter 91.

Only one photodetector 39 is depicted receiving the light from the fiber delay lines 34 and 36 in FIG. 10A. This is only an apparent simplification. One photodetector 39 might seem simpler than two photodetectors 38, 40, but the use of one photodetector 39 will, for sufficiently short delay lines 34, 36, require tight phase control between the two loops so that an out-of-phase condition between the two loops does not cause the light cancel when combined (if the light is mutually coherent). Thus, the use of two photodetectors 38 and 40, one associated with each delay line 34 and 36, is preferred for all embodiments, including the embodiment of FIG. 10A. When only a single photodetector 39 is used, the optical paths with the delay lines 34, 36 would also preferably include optical phase shifters 291, 391 to provide fine adjustments of the two optical signals produced by the delay lines 34, 26 and summed at the photodetector 39.

FIG. 9B is a block diagram of an embodiment according to the present invention comprising a multi-loop, multi-tone photonic oscillator and a frequency-modulated optical heterodyned synthesizer. In FIG. 9B, the multi-loop, multi-tone photonic oscillator 14 has a fiber length control apparatus 92' and a feedback loop to control the fiber lengths of delay lines 34 and 36. Similar to the apparatus depicted in FIG. 9A, the delay lines 34, 36 are apt to be sufficiently long that as they change length in response to changes in temperature of their environment, the change in temperature will adversely affect the phase of the oscillator 14. Thus, the fiber length control apparatus 92' may comprise heating and/or cooling apparatus as described above, or means to physically stretch or strain the fiber 34, 36 as described above (such as piezoelectric fiber stretchers), or other length control means known in the art. The feedback control circuit preferably comprises a tone select filter 96, a frequency divider 94', a mixer 98' and a filter 100 that controls the fiber length control apparatus 92'. The tone select filter 96 selects one of the generated tones output from modulator 32' and the frequency divider 94' divides down the selected tone for comparison, by mixer 98', against a reference tone available from, for example, a low noise reference oscillator 24'. The output of mixer 98' is filtered to remove unwanted mixing products and then applied as a control signal to the fiber length control apparatus 92'. Hence, the lengths of the fibers 34, 36 may be adjusted in response to changes in one of the frequencies generated by the photonic oscillator 14.

Similar to the apparatus depicted in FIG. 9A, the optical intensity modulator of the embodiment shown in FIG. 9B is preferably implemented as an electroabsorption modulator 32'. An electroabsorption modulator 32' not only modulates the amplitude of the lightwave carrier supplied by laser 70 but it also produces a photocurrent 93 that is fed to the tone select filter 96 in the feedback circuit. Alternatively, the feedback from the loops may be obtained at the outputs of the photodetectors 38, 40. In another embodiment, the two photodetectors 38, 40 may be replaced by a single photodetector 39, similar to the configuration shown in FIG. 10B.

The apparatus depicted in FIG. 10B is similar to FIG. 9B, but instead of having a fiber length control apparatus 92', the apparatus utilizes phase control of the loop to compensate for environmental changes in the lengths of the fibers 34, 36 in the multi-loop, multi-tone photonic oscillator. An electrical phase shifter 91 is placed in the multiple loops of the oscillator 14 and is utilized in lieu of the fiber length control apparatus 92' to compensate for changes in the lengths of the fibers 34, 36. The feedback circuit depicted in FIG. 9B is used to control the electrical phase shifter 91. This feedback circuit taps off a portion of the photodetected and amplified multi-tone waveform to determine its departure from the frequency and phase of the reference oscillator 24'.

Similar to the apparatus shown in FIG. 10A, only one photodetector 39 is depicted receiving the light from the delays lines 34, 36 in Figure 10B. Again, one photodetector 39 might seem simpler than two photodetectors 38, 40, but the use of one photodetector 39 will, for sufficiently short delay lines 34, 36, require tight phase control between the two loops (possibly up to within fractions of the optical wavelength) so that an out-of-phase condition between the two loops does not cause the light to cancel when combined (if the light is mutually coherent). Thus, the use of two photodetectors 38 and 40, one associated with each delay line 34 and 36, is preferred for all embodiments, including the embodiment of FIG. 10B.

The multi-tone, optical comb generator 14 can alternatively be of a prior art design, such as that disclosed by reference 1 (U.S. Pat. No. 5,723,856 or the article by S, Yao and L. Maleki) or even possibly reference 3 (the article by S. Bennett) mentioned above. Such a design is not preferred because of its non-continuous output. Injection seeding of the photonic oscillator 14 may be needed to initiate oscillations in multiple tones. A suitable injection seeding scheme is disclosed in the U.S. patent application entitled "Injection-seeding of a Multi-tone Photonic Oscillator" referred to above (U.S. Ser. No. 60/332,367 and U.S. Ser. No. 10/116,801).

Figure 11:
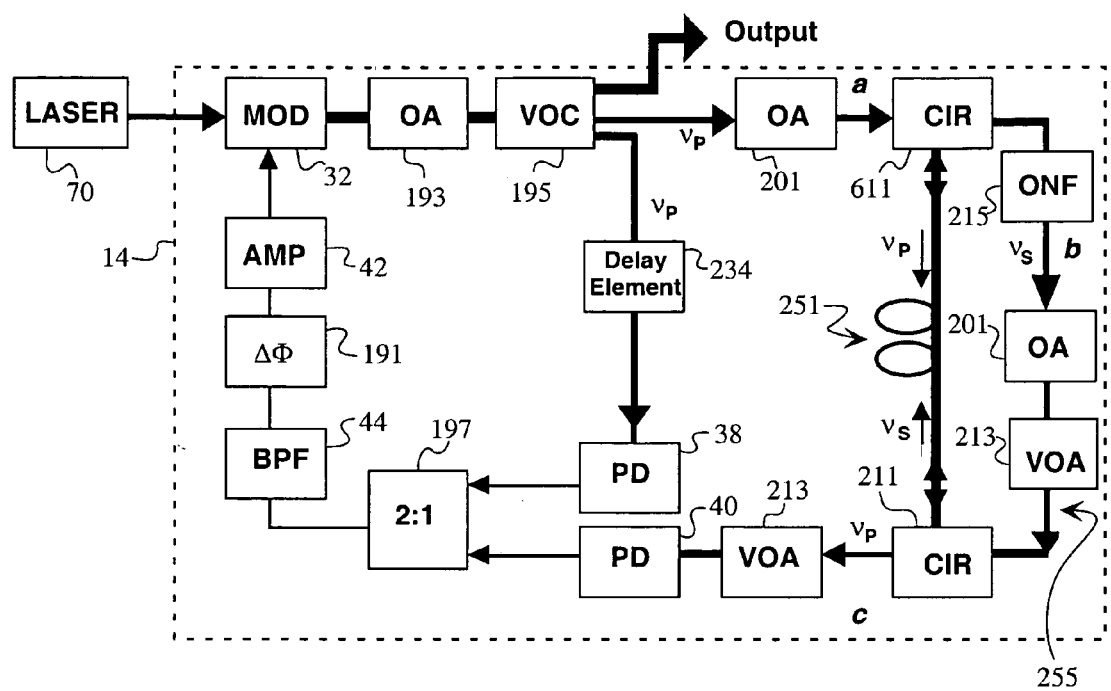
FIG. 11 is a block diagram of an alternative embodiment of a multi-tone photonic oscillator.

In another embodiment of the present invention, the multi-tone photonic oscillator 14 can be implemented using an additional loop in its optical feedback path, as shown in FIG. 11. The additional loop produces a Stokes seed for selectively enhancing stimulated Brillouin scattering (SBS) in the long loop of the multi-tone photonic oscillator 14. The use of selective SBS in the optical fiber loop of the photonic oscillator 14 attenuates those tones produced by the oscillator 14 whose intensities exceed some threshold value, as described in additional detail below. Having the intensities of the tones clamped at a threshold value produces a multi-tone waveform whose tones are more uniform in intensity. More uniform tone intensities may produce a RF carrier waveform that is more desirable for use in RF sensor systems, such as those in which low probability of interception is a design goal.

Similar to the multi-tone photonic oscillator 14 depicted in FIG. 3, the multi-tone photonic oscillator 14 shown in FIG. 11 comprises an optoelectronic feedback loop that has a RF-lightwave output. A laser 70 supplies an optical signal with an optical carrier to the oscillator 14. An optical modulator 32 modulates the light from the laser 70, resulting in a RF-lightwave output whose frequency spectrum consists of the optical carrier and modulation sidebands. Generally two sets of sidebands are produced, which are at frequencies higher and lower than the optical carrier, respectively. For a multi-tone oscillator, the modulation sidebands comprise multiple frequency tones. The photonic oscillator 14 may be used in combination with a photodetector (not shown in FIG. 11) that is connected to the output of the photonic oscillator 14. That photodetector converts the RF-lightwave signal into a RF signal whose frequency spectrum likewise has multiple tones.

The optoelectronic feedback loop of the multi-tone photonic oscillator 14 contains two optical branches or paths and a common electrical and optical path. The common path contains at least the modulator 32, an optical coupler (VOC) 195 or splitter, an electrical combiner (2:1) 197 and an electrical bandpass filter (BPF) 44. The common path may also contain one or more electronic amplifiers (AMP) 42 and optical amplifiers (OA) 193, 201 as well as electrical or optical variable phase shifters (ΔΦ) 191. The optical coupler 195 could be variable so that the relative amounts of power in its multiple outputs are varied. Those skilled in the art will understand that the relative locations of some of these components may be changed or that some of the components may be eliminated in accordance with alternative embodiments of the present invention.

A first optical branch or path contains at least a photodetector (PD) 38 and an optical delay element 234. This delay element 234 could be a length of optical waveguide or fiber. The overall time delay of the signal that traverses the first optical branch and the common path establishes the minimum frequency spacing of the multiple tones produced by the photonic oscillator 14. A fiber length of 2 meters would result in a tone spacing that is on the order of 100 MHz, for example. For the photonic oscillator 14 according to this embodiment of the present invention, that frequency spacing is preferably larger than the gain bandwidth of Stimulated Brillouin Scattering (SBS). That gain bandwidth is typically 30-50 MHz or smaller, for high-quality optical fiber.

A second optical path contains another photodetector 40 and optical components that produce a longer delay than the first path. These optical components may simply comprise a long length of optical fiber (>100 meters). However, in the multi-tone photonic oscillator 14 depicted in FIG. 11, the second path makes use of the SBS effect, as described in additional detail below. The second optical path may also be used to reduce the phase noise of the tone in the comb, as described in accordance with the embodiments depicted in FIGS. 3, 6, 9 and 10.

As indicated, the multi-tone photonic oscillator 14 shown in FIG. 11 makes beneficial use of Stimulated Brillouin Scattering (SBS), which typically is an undesired non-linear effect that occurs in optical fiber. SBS is a well-known effect that can be observed especially in long lengths of uniform optical fiber or in high-Q optical-fiber resonators and at high optical power levels. SBS is described in some detail in the book *Nonlinear Fiber Optics* by G. P. Agrawal (Academic Press, 1995). When SBS occurs, some of the energy in the light propagating in the forward direction is coupled into light propagating in the reverse direction. This phenomenon is a non-linear effect in the optical fiber that is related to certain vibrational-excitation modes (acoustic phonons) of silica (the constituent material in optical fiber). Essentially, a photon of the forward-propagating light (at frequency $v_P$) is annihilated to create a photon of the reverse-propagating light (at a down-shifted Stokes frequency $v_S$) as well as an acoustic phonon of the proper energy and momentum. The amount of down shift is usually called the Stokes shift and can be described by $v_B = 2v_s/(c/n)v_P$. $v_B$ is approximately 10.5 GHz for light of 1550 nm wavelength, where $v_s$ and $(c/n)$ are the speeds of the sound and light in the fiber, and $v_P$ is the optical frequency of the forward-propagating light. The SBS effect has a finite bandwidth that is typically described as the Brillouin gain bandwidth. This bandwidth $\Delta v_B$ is about 30-50 MHz for silica fibers at 1550 nm, but it can be broader if there are inhomogeneities in the fiber due to manufacturing, temperature or stress variations along the fiber. If the forward-propagating light comprises multiple tones that have a frequency spacing greater than the bandwidth $\Delta v_B$, each tone interacts independently with the silica medium.

For small signals, the growth of the reverse-propagating Stokes light can be described by an exponential relation, $\exp[g(v) (P_p/A_c)L_{\it eff}]$. Here $g(v)$ is the gain coefficient, $P_p$ is the forward-propagating "pump" power, $A_c$ is the effective core area of the fiber and $L_{\it eff}$ is the effective fiber length (that is, $[1-\exp(-\alpha L)]/\alpha$, where L is the fiber length and $\alpha$ is the absorption coefficient). $g(v)$ has a Lorentzian line shape with a peak at $v_S = v_P - v_B$, and bandwidth $\Delta v_B$. $g(v_S)$ has a value of about $5 \times 10^{-11}$ cm/W for pure silica fibers and it is wavelength independent. SBS is a stimulated-conversion process that can be described as having a threshold. For conditions such as optical power levels above the threshold, that process is appreciable. For conditions below the threshold, that process is minor. SBS thresholds at 1550 nm wavelength have been measured for several common types of optical fiber (see, for example, C. C. Lee and S. Chi, IEEE Photonics Technology Letters, 2000, vol. 12, no. 6, p. 672). For example, thresholds are typically between 5-10 mW for 25 km lengths of fiber. Note that this would be the threshold for each tone separated in frequency by more than the SBS bandwidth. For input powers higher than the SBS threshold pump power $P_{thres}$, the transmitted power is clamped to approximately $(P_{thres})\exp(-\alpha L)$ and the excess power $(P_p-P_{thres})$ is converted into a strong Stokes beam propagating in the backward direction. The effective bandwidth of the interaction also is reduced, to $\Delta V_B/(g_0 L_{eff})^{1/2}$, due to exponential gain in the stimulated scattering process. SBS can be significant in the long branch of the photonic oscillator 14 if that branch contains a sufficiently long length of optical fiber and high levels of optical power in the multiple tones.

The effect of SBS in the photonic oscillator depicted in FIG. 11 is illustrated in FIG. 12 which shows both sets of modulation sidebands in the RF-lightwave signal. The spectrum of light input to that fiber is illustrated at line a of FIG. 12. This spectrum also corresponds to the spectrum that would be seen at point "a" of FIG. 11 at the output of optical amplifier 201 immediately following the optical coupler 195. The forward-propagating light 295 output from the fiber has a spectrum that is illustrated at line c of FIG. 12. This spectrum also corresponds to the spectrum that would be seen at point "c" of FIG. 11 at the output of a first circulator 211. Note that the power in each tone has been clamped to some threshold value. That power is converted into the backward-propagating light 296, whose spectrum is illustrated at line b of FIG. 12.

It would generally be difficult to achieve the high levels of optical power, per tone, that is needed for the SBS clamping effect to be significant. The additional elements of the multi-tone photonic oscillator 14 provide a means to accomplish that SBS clamping at lower levels of optical power in the incident, forward-propagating light. The photonic oscillator 14 illustrated in FIG. 11 contains an additional optical branch or loop. This loop contains a first and second optical circulator (CIR) 211, 611, a length of optical fiber 251 and one or more optical amplifiers 201. The loop may also contain variable optical attenuators 213 and an optical notch filter (ONF) 215. The Stokes light from the second optical branch is directed into the additional optical loop by the first and second circulators 211, 611. This Stokes light is amplified before being reinjected, in the reverse direction, into the second optical branch. The notch filter 215 reduces the component of the Stokes light that is associated with the backward propagating light 296. The Stokes light injected from the loop acts as a seed for SBS in the optical fiber 251 of the second optical branch. The seeding is effective because SBS depends on the intensities of both the reverse-propagating Stokes light and the forward-propagating light. The gain obtained from each optical amplifier in the additional loop can be greater than 20 dB. Thus, the SBS power threshold of the incident, forward-propagating light could be reduced substantially.

As briefly discussed above, the spectra that could be observed at points "a," "b" and "c" of the photonic oscillator shown in FIG. 11 are illustrated in FIG. 12. Note that the spectrum of the signal exiting the second branch (as shown at line c of FIG. 12) has tones of more uniform intensity than the spectrum of the signal entering the second branch (as shown at line a of FIG. 12). Also, the power at the optical carrier frequency 295 may be reduced.

Figure 13:
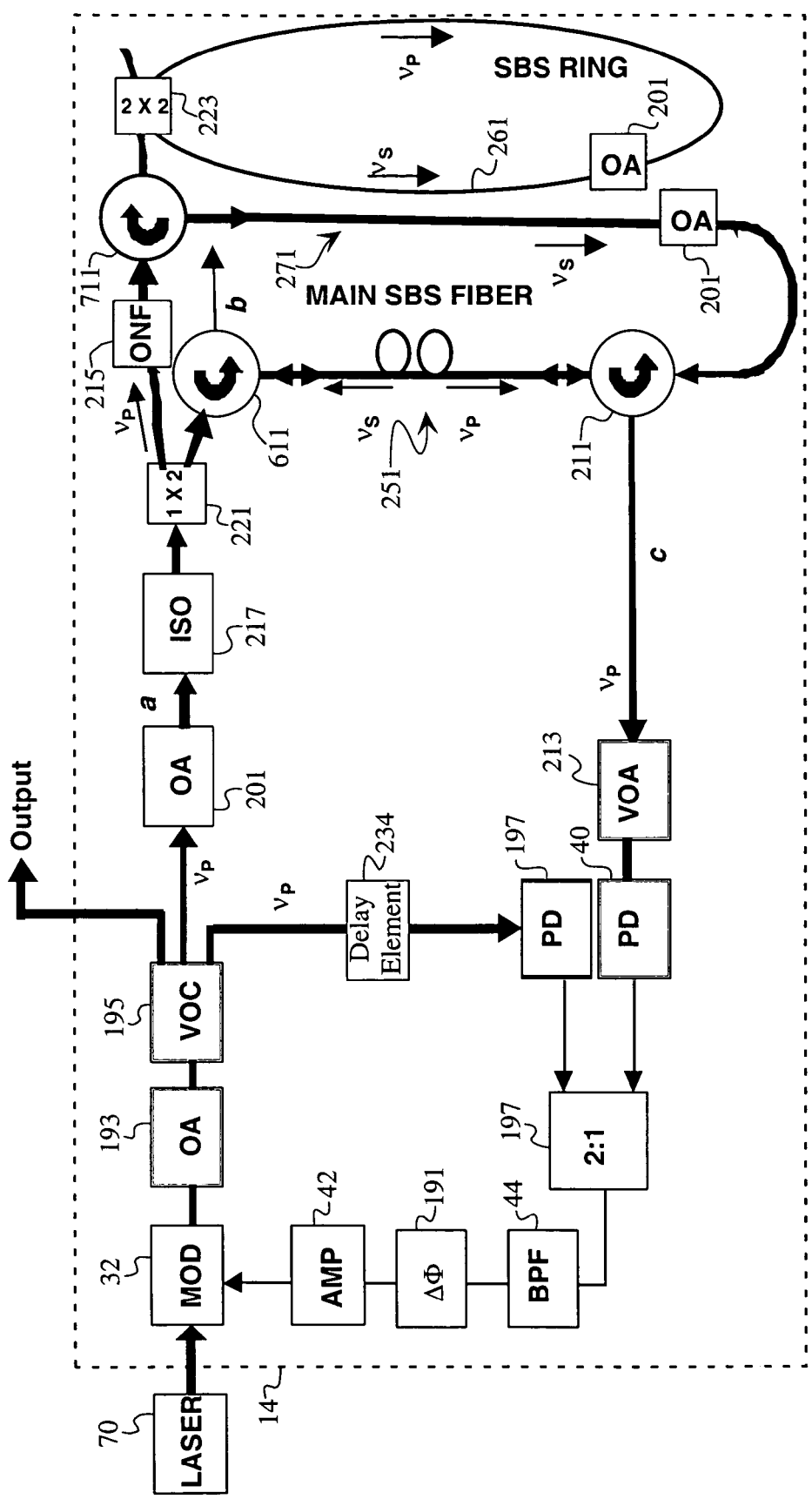
FIG. 13 is a block diagram of another embodiment of a multi-tone photonic oscillator.

In another embodiment of the present invention, the multi-tone photonic oscillator 14 can be implemented using a different configuration of a loop in its optical feedback path, as shown in FIG. 13. The photonic oscillator 14 shown in FIG. 13 has a different implementation of the loop that provides the Stokes light that seeds the SBS in the second optical path. With this approach, a fraction of the input signal (typically, 0.1-1 mW) is fed into a Stokes seed generator. In one embodiment, this generator contains a recirculating ring. As shown in FIG. 13, this generator contains a loop or ring 261 of optical fiber, a third optical circulator 711 and 2×2 coupler 223 for coupling light into and out of the fiber loop or ring 261. The ring 261 recirculates both the input light tapped, at frequencies $v_P$, and the Stokes shifted light, at frequencies $v_S$, produced by SBS in the ring 261. The threshold pump power for SBS oscillations is reduced in a ring 261 because of the recirculation. That threshold is set so that the dominant tones of the comb produce appreciable amplification into optical path 271 of the Stokes shifted energy. A portion of the Stokes shifted light from the ring 261 is tapped off, is amplified by optical amplifier 201, and is fed into the far end of the main SBS fiber 251 (which is in the second optical branch) such that it counterpropagates to the signal-carrying light. In the main SBS fiber 251, the Brillouin amplification of this Stokes-shifted light at $v_S$ clamps the intensities of the various incident tones at $v_P$. As with the photonic oscillator illustrated in FIG. 11, a Stokes seed is being provided for the SBS effect.

The second optical branch in the photonic oscillator 14 shown in FIG. 13 contains an optical isolator (ISO) 217, an optical splitter (1×2) 221, a length of optical fiber (the main SBS fiber) 251 and the first optical circulator 211. This branch also could contain a second optical circulator 611 that provides an output port for monitoring the Stokes light in the branch. This branch may also contain an optical notch filter 215 to reduce the optical carrier so that its associated Stokes light is not generated by SBS in the Stokes seed generator. Consequently, the optical carrier component at $v_P$ will not be clamped by its associated Stokes light. The isolator 217 and the circulators 211, 611 keep the Stokes light and Stokes-shifted frequency components from feeding into the common path of the photonic oscillator 14. A portion of the light output from the optical splitter 221 is coupled into the main SBS fiber 251. Another portion is coupled into the Stokes seed generator. The third optical circulator 711 associated with the ring 261 separates the signal light to be coupled into the ring 261 from the Stokes light coupled out of the ring 261. The 2 X 2 coupler 223 couples a portion of the signal light into the ring 261 and a portion of the Stokes light (produced by SBS in the ring) out of the ring 261. The minimum length of the ring 261 and the coupling strength of the 2 X 2 coupler 223 are selected to determine which tones of the comb produce a Stokes seed. The ring 261 also may contain additional optical amplifiers 201 that result in amplification of the Stokes seed.

The recirculating ring 261 shown in FIG. 13 is an optical resonator that can be described by a set of resonance frequencies, each having a linewidth. Since the tones of the RF-lightwave signal produced by the photonic oscillator 14 are known, the ring 261 can be designed to have a subset of those resonance frequencies coincide with the optical frequencies of the tones. This adjustment of the resonance frequencies can be done by adjusting the length of the fiber in the ring 261. It would be preferable to design the ring resonator to have a linewidth that is larger than anticipated drift in the tone frequencies. Common SBS ring resonators have a finesse of 100 or larger. The coupling strength of the 2 X 2 coupler 223 determines the linewidth of the ring resonator, since the attenuation of light in the fiber ring 261 is so small. The optical spectra illustrated in FIG. 12 also could be observed at the points labeled "a," "b" and "c" in FIG. 13. Again, the intensities of the tones exiting the second branch are clamped. Some adjustment of the gains of the electronic amplifiers 42 and optical amplifiers 193, 201 as well as the attenuations of the various variable optical attenuators 213 may be needed to achieve the desired threshold levels for ensuring uniform tone intensities. The coupling strength of the 2 X2 coupler 223 and the length of the fiber in the ring 261 may also be adjusted to obtain the desired tone intensities.

Figure 14:
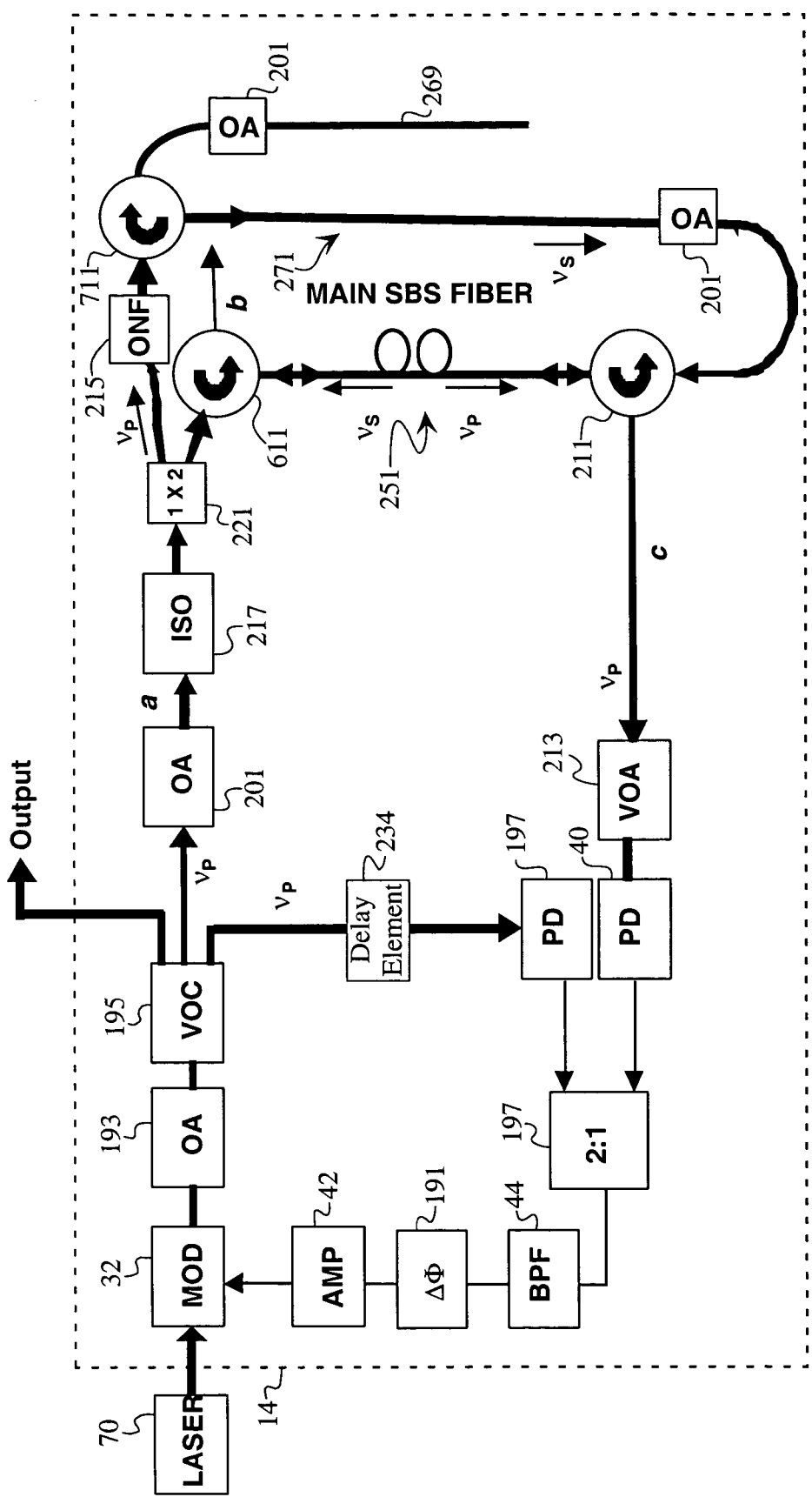
FIG. 14 is a block diagram of still another embodiment of a multi-tone photonic oscillator, similar to that depicted in FIG. 13.

A variation of the embodiment of FIG. 13 is shown in FIG. 14. This variation uses a length of optical fiber 269 instead of the combination of the coupler 223 and optical fiber in a closed ring 261. Light from the modulator 32 is coupled via a third circulator 711 to this fiber 269. An optical amplifier 201 may be used to amplify the light that is coupled to the optical fiber 269. Backward propagating Stokes light is generated by SBS in the optical fiber 269. That Stokes light is then directed by the third circulator 711 towards an optical amplification path 271. The optical amplification path 271 may contain an optical amplifier 201 that amplifies the Stokes light before the first circulator 211 directs that light back into the main SBS fiber path 251.

Note that the frequencies of the Stokes light are typically offset by >10 GHz from the frequencies of the tones produced by the multi-tone photonic oscillator. Since the frequency range covered by those tones is generally less than 5 GHz, it is possible to select the frequency band of those tones such that the optical frequencies of the Stokes light and the photonic-oscillator tones do not overlap, for both the upper and lower modulation sidebands. For example, centering the multiple tones about 15 GHz would accomplish this objective. In this way, the bandpass filter 44 of the common path could further attenuate any spurious tones that may result from the SBS.

As briefly discussed above, the tone spacings for the multi-tone photonic oscillators 14 illustrated in FIGS. 11, 13, and 14 are preferably greater than the SBS bandwidth. That is, the SBS bandwidth is typically 30-50 MHz. Therefore, the tone spacings for the oscillators in FIGS. 11 and 13 are preferably greater than 50 MHz.

Figure 15:
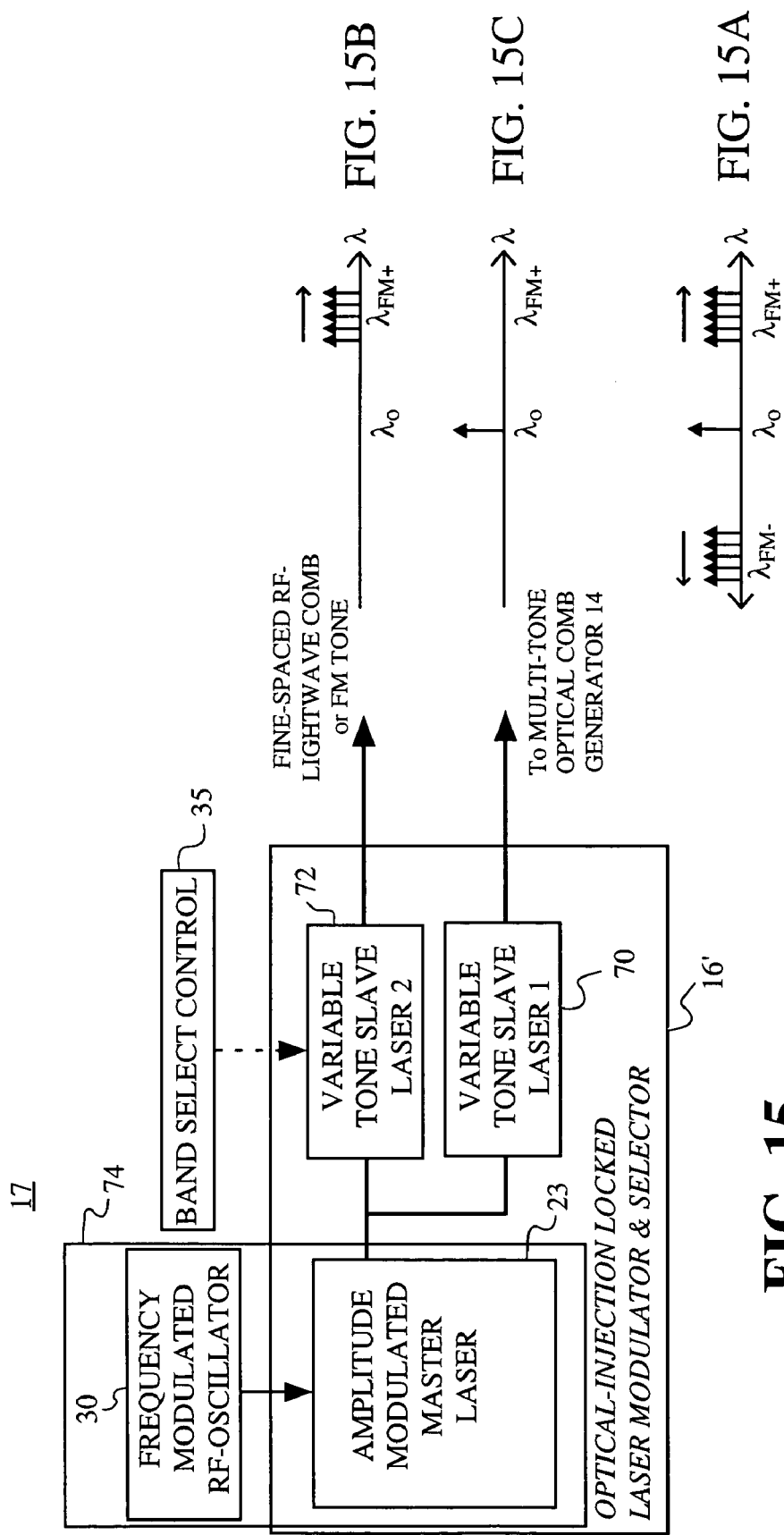
FIG. 15 is a block diagram of the laser modulator and selector shown in FIG. 2B.

Returning now to the frequency modulated spread waveform generator depicted in FIG. 2B, implementations and functions of components other than the photonic oscillator 14 are described below. FIG. 15 shows a block diagram of the frequency-modulated-tone or fine-spaced-comb generator 17 that comprises the first segment of the waveform generator. This generator 17 contains a frequency modulated RF oscillator 30 and also a laser modulator-selector 16'. The laser modulator—selector 16' is comprised of at least three lasers. One of the lasers is the master laser 23 and the other two lasers are the slave lasers 70, 72. The optical output of the master laser 23 is injected into the two slave lasers 70, 72. The light from the master-laser 23 optically injection locks the slave lasers 70, 72 so that the light emitted from a slave laser 70, 72 has the same frequency content as the injected light that is within the injection-locking bandwidth of the slave laser 70, 72. The frequency modulated RF oscillator 30 comprises an oscillator that produces a single RF tone and a means to frequency modulate this RF tone. Such means are known in the art (e.g., a VCO). For a periodic frequency modulation, a large FM index is desired in order to produce a Fourier spectrum that consists of many spectral sidebands. The intensities of the sidebands depend on the waveform shape used for the frequency modulation. The types of waveform shapes and their resulting modulation-sideband spectra are also known per se in the art. For example, some periodic frequency modulation waveforms can produce sideband spectra having tones of uniform intensity. The center of these sidebands typically has a frequency of several GHz to several tens of GHz. The preferred extent or bandwidth of the FM sidebands depends on the application needs and the electronic components available to produce—the frequency modulated RF waveform. This bandwidth typically is in the range of 10-200 MHz.

The frequency-modulated RF signal produced by the RF oscillator 30 is used to amplitude or intensity modulate the master laser 23. This laser 23 preferably emits in a single optical wavelength, when it is not modulated. The master laser 23 can be a single tone laser whose current is modulated by the frequency-modulated RF signal. The result is a fixed-tone optical carrier (the un-modulated laser wavelength) and a pair of modulation sidebands whose frequencies change with time (See FIG. 15A). The master laser 23 also can comprise a laser and a separate modulator. In that case, the frequency-modulated RF signal is generally applied as a voltage that changes the intensity of light passed through the modulator. Thus, the laser produces a fixed tone and the modulator applies the modulation sidebands. Both direct modulation of a laser and use of a laser with a separate (external) modulator are well known techniques for modulation of laser light.

The output wavelength spectrum (from which the frequency spectrum can be derived) of the master laser is illustrated by FIG. 15A. This spectrum contains three components, a fixed center wavelength $\lambda_0$, which is the un-modulated laser wavelength, as well as two modulation sidebands, which are at shorter wavelengths, $\lambda_{FM-}$, and longer wavelengths, $\lambda_{FM+}$. A selector 35 selects one of these sidebands as well as the un-modulated laser wavelength. This selector selection is achieved as a result of the optical-injection locking properties of the slave lasers 70, 72. The two slave lasers 70, 72 preferably are constructed from semiconductor laser diodes. Such lasers typically have an injection locking bandwidth that is less than several GHz. By using a RF center tone that is sufficiently higher in frequency than this injection locking bandwidth, the modulation sidebands of the master laser 23 are spaced further away from the un-modulated laser wavelength (and from each other) than the injection locking bandwidth of the slave lasers 70, 72. Thus each slave laser 70, 72 can be locked only to one of the three components of the master laser emission spectrum. One slave laser 70 (laser number 1) preferably has its free-running wavelength selected to match the un-modulated master laser wavelength. The other slave laser 72 (laser number 2) can preferably be tuned to select either one of the two modulation sidebands. Tuning of their drive current and/or junction temperature typically tunes the free-running wavelength of these lasers 70, 72. Selection of the longer-wavelength sideband is illustrated in FIG. 15B. The band selector circuit 35 controls the selection between those two sidebands. This band selection, combined with the choice of the center frequency of the tones generated by the photonic oscillator, can be used to determine the frequency band of the final output RF waveform.

The optical signal injected into slave laser 72 actually is a single tone whose wavelength changes with time, according to the electronic frequency-modulation waveform of the RF oscillator 30. This change in wavelength occurs slowly compared to the relevant lifetimes associated with the optical-injection locking response of slave laser 72. These lifetimes include the effects of the photon lifetime in the optical cavity of the laser 23 and the stimulated emission lifetime of the electronic carriers in the laser 23. The response of a laser often is described in terms of its relaxation-oscillation frequency. The change in wavelength of the optical injection signal is slow compared to this relaxation-oscillation frequency, which is typically on the order of GHz. Since the optical injection signal changes so slowly, it can be approximated as not changing at all. The rate at which the wavelength of the optical injected signal changes is typically between 0.1 MHz and 100 MHz, which satisfies this criterion. Injection locking of a slave laser to a frequency or wavelength modulated master laser has been investigated experimentally. This investigation by Kobayashi, Yamamoto and Kimura of NTT is described in Electronics Letters, vol. 17, no.22, pp. 850-851 (1981). The authors demonstrated that so long as the excursion of the frequency or wavelength modulation is less than 20-50% of the optical-injection locking bandwidth of the slave laser, that output wavelength of that slave laser can be pulled to track the injected wavelength.

The optical signal injected into slave laser 70 is of a single constant wavelength. Slave laser 70 is preferably a device that emits in a single wavelength and is preferably a distributed feedback (DFB) laser diode. Optical injection locking of DFB lasers to single constant wavelength light is a well-characterized phenomenon.

Figure 16:
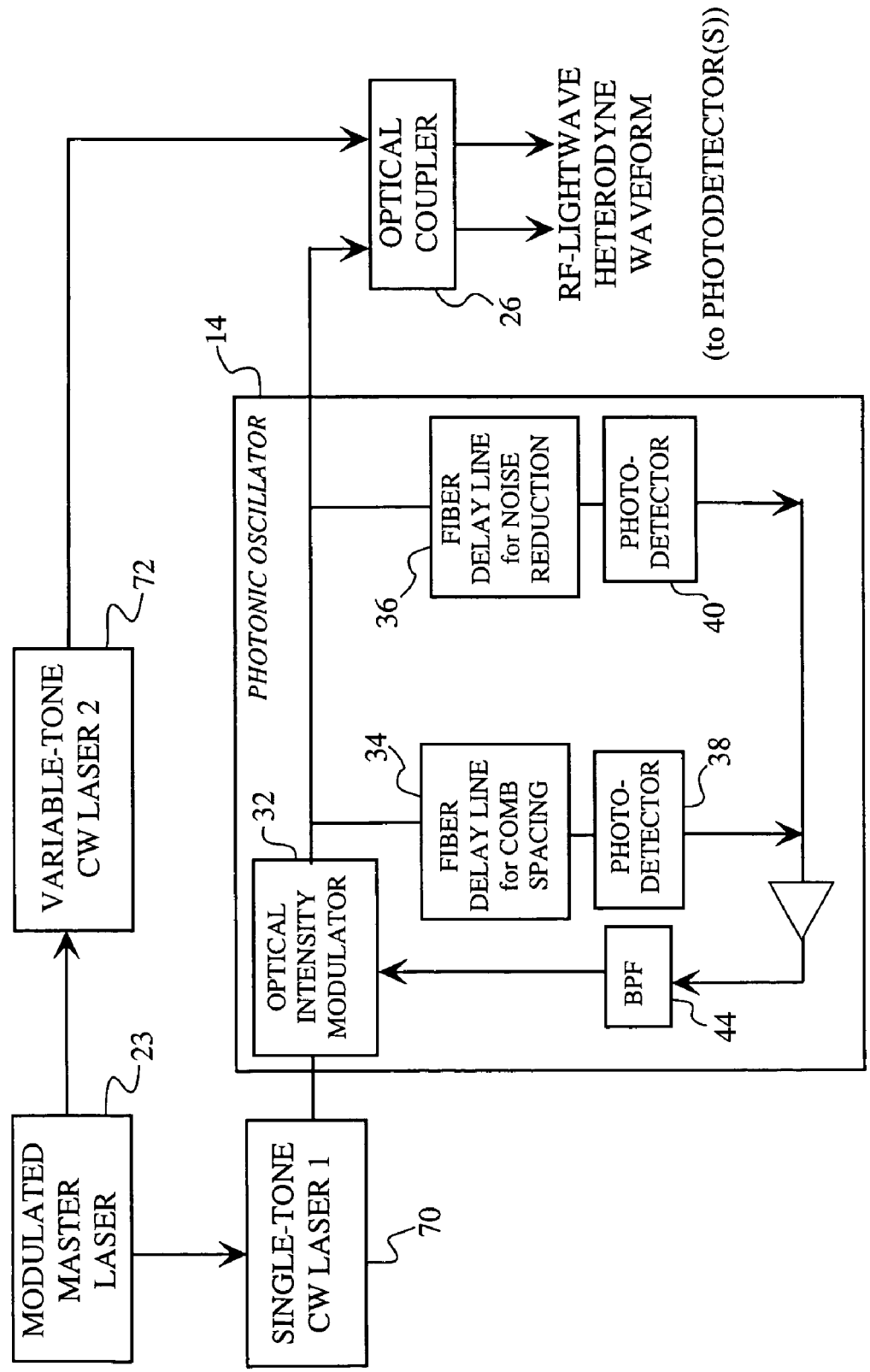
FIG. 16 is a block diagram showing elements of FIG. 15 with the photonic oscillator of FIG. 3.

The basic elements of a coarse-spacing comb generator according to an embodiment of the present invention are illustrated in FIG. 16. In this figure, the multi-tone optical comb generator 14 is depicted as taking the form of the embodiment thereof previously discussed with reference to FIG. 3. However, the multi-tone optical comb generator 14 may be modified to alternatively conform to any of the embodiments discussed above, or to conform to comb generators known in the art.

Representative frequency spectra produced at various locations in the waveform generator are illustrated in FIGS. 17A-17D. The single-tone, un-modulated output from slave laser 70, illustrated by FIG. 17B, is fed to photonic oscillator 14. This tone is at the frequency, $f_o$, of the master laser 23. The photonic oscillator 14 has been described above. The output spectrum of the photonic oscillator 14 in the coarse-spacing comb generator contains a main tone at $f_o$ and also additional oscillator tones at $f_{PO1+}$, $f_{PO2+}$, $f_{PO3+}$ and so on, as illustrated in FIG. 17D. These addition tones are amplitude-modulation sidebands produced by the photonic oscillator 14. Amplitude modulation produces tones both on the high frequency side and on the low frequency side of the main tone $f_o$. The set of tones ($f_{PO1-}$, $f_{PO2-}$, $f_{PO3-}$ . . . ) located on the low-frequency side of the main tone is not shown in FIG. 17C. The sideband optical frequency tones are offset from the main tone by the frequency spacings of $f_{CO1+}$, $f_{CO2+}$, $f_{CO3+}$ and so on (with $f_{PO1-}-f_o=f_{CO1+}$, for example). Those frequencies $f_{CO1+}$, $f_{CO2+}$, $f_{CO3+}$ . . . can be considered as a comb of RF tones that modulate the optical intensity modulator 32 of the photonic oscillator 14. In general, that comb has a bandwidth that is determined by the width of the bandpass filter 44. The tone spacing (equal to $f_{CO2+}-f_{CO1+}$, for example) is determined by the length of one of the fiber delay-line loops (loop 34). The bandwidth covered by these multiple tones can be quite wide, e.g., many GHz. Note that the output of slave laser 72 is also shown, by FIG. 17A, and can have a Fourier spectrum with tones at the optical frequencies of . . . $f_{FM1-}$, $f_{FM0}$, $f_{FM1+}$ . . . .

The RF-modulated lightwave signals from slave laser 72 and from the photonic oscillator 14 are combined, using an optical coupler 26, onto the same optical fiber. An optical directional coupler of the proper coupling length can be used to form two sets of combined outputs, which are carried by two output optical fibers. The optical coupler 26 is shown in FIGS. 2B and 16. The combined output is the desired RF-lightwave heterodyne waveform. This output will have spectral components located at four frequency regions (e.g., . . . $f_{FM1-}$, $f_{FM0}$, $f_{FM1+}$ . . . , $f_{PO1+}$, $f_{PO2+}$, $f_{PO3+}$ . . . and $f_{PO1-}$, $f_{PO2-}$, $f_{PO3-}$ . . . ).

At the waveform combiner 15, optical heterodyning of two RF-modulated lightwave signals generates the desired dense frequency spread waveform. The first of the signals is produced by the photonic oscillator 14 and has multiple coarse-spaced tones. The second of the signals is produced by slave laser 72 and has a single tone whose frequency varies periodically with time, which might result in a Fourier spectrum comprising multiple fine-spaced tones. The spacing of those fine-spaced tones are determined by the frequency modulation rate of the RF signal oscillator. The first and second signals are at different optical wavelengths. Both optical signals are directed onto at least one photodetector 18, 20. The at least one photodetector 18, 20 optically heterodynes these two signals. That heterodyning process produces a mixture of sum and difference frequency components derived from these two RF-modulated lightwave signals. Some of these frequency components are in the optical range and not output by the at least one photodetector 18, 20. Others are in the RF range and most of these may be output by the at least one photodetector 18, 20 if those components are within the bandwidth of the photodetector 18, 20. One who is skilled in the art can readily derive these frequency components. Some of these components include frequencies at ($f_{PO1+}-f_{FM1+}$), ($f_{FM1+}-f_o$), ($f_{PO1+}-f_o=f_{CO1+}$), and ($f_{PO1+}-f_{PO1-}=2f_{CO1+}$).

Two groups of heterodyne components represent dense spread tones that are produced by interleaving the fine-spaced tones of the first RF-lightwave signal with the coarse-spaced tones of the second RF-lightwave signal. One of these two groups contains the components: ($f_{PO1+}-f_{FM1+}$), ($f_{PO1+}-f_{FM0}$), . . . ($f_{PO2+}-f_{FM1+}$), ($f_{PO2+}-f_{FM0}$), . . . This group is illustrated by FIG. 17D. Another group contains the components: ($f_{FM1+}-f_{PO1-}$), ($f_{FM0}-f_{PO1-}$), . . . ($f_{FM1+}-f_{PO2-}$), ($f_{FM0}-f_{PO2-}$), . . . _(not illustrated, but similar to FIG. 17D). Preferably, a RF bandpass filter (not shown) is used after the at least one photodetector 18, 20 to select one of the groups of heterodyne components. The resultant, frequency spread, RF waveform represented by each group of dense spread tones has a total frequency bandwidth that is determined by the coarse-spaced multi-tone modulation from the second RF-lightwave signal and has a tone spacing that is determined by the frequency-modulation rate resulting in the first RF-lightwave signal. The fine-spaced tones are intended to be interlaced into the coarse-spaced tones and to fill in the gaps between those tones. Thus, the extent or range of their frequency modulation should preferably match the coarse tone spacing.

Additional groups of heterodyne components contain only coarse-spaced tones, only fine-spaced tones or a single frequency modulated tone. Those other groups of tones also could be useful in a sensor system. If the center frequencies of the photonic oscillator RF passband and of the frequency-modulated RF signal (input to the master laser) are chosen properly, those additional groups can be well separated from the desired dense spread tones. An example is provided below to illustrate the selection of center frequencies, bandwidths and tone spacings. For this example, what is desired is a dense spread waveform whose frequency spectrum consists of a comb of tones with a tone spacing of 20 MHz and that covers a bandwidth of 2 GHz. This waveform is centered at 4 GHz. A second desired dense spread waveform is centered at 20 GHz. One scheme to achieve these waveforms involves modulating the frequency of a single-tone RF signal, which has a center frequency of 8 GHz. The rate of the periodic frequency modulation is 20 MHz and the total frequency excursion is 200 MHz. Note that appropriate FM waveforms can be chosen to achieve tones of uniform amplitude. When this frequency modulated RF signal amplitude or intensity modulates the master laser, the spacing between the center wavelength of the laser and its modulation sideband is much larger than the injection locking bandwidths of the slave lasers, which typically is 1-2 GHz. The photonic oscillator 14 has a RF bandpass filter with a center frequency of 12 GHz and a passband width of 2 GHz. This photonic oscillator 14 has the length of its optical-fiber loop set for a tone spacing of 200 MHz. The optical heterodyned output from the photodetector has spectral components located at 3-5 GHz, 7.9-8.1 GHz, 11-13 GHz, 19-21 GHz, and 23-25 GHz. The components located at 3-5 GHz and at 19-21 GHz are the dense spread carrier waveforms. The component located at 7.9-8.1 GHz is a set of fine-spaced tones. The components located at 11-13 GHz and at 23-25 GHz have only coarse-spaced tones. Note that these sets of spectral components are spaced far from each other and can be selected easily by RF bandpass elements.

Figure 18A:
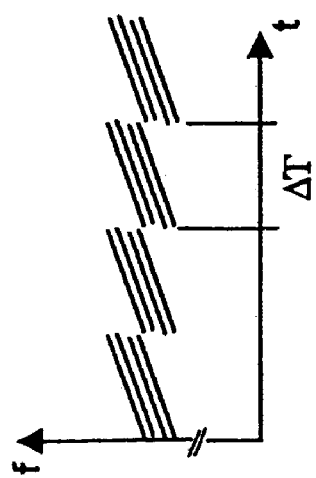
FIGS. 18A-18C illustrate various frequency-modulated spread waveforms that can be generated.
Figure 18B:
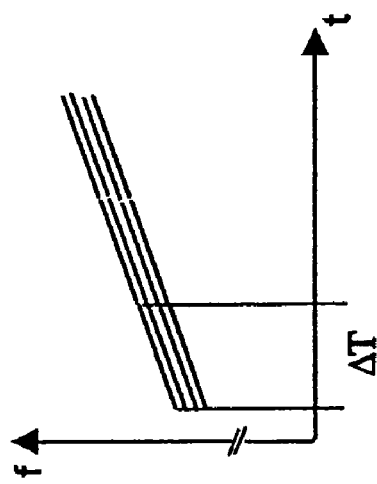
Figure 18C:
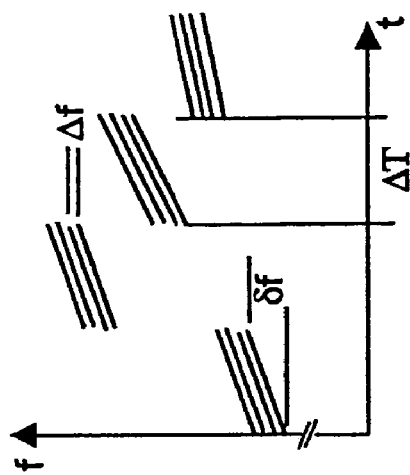

Examples of the types of frequency modulated waveforms that could be generated by the apparatus of this invention are illustrated in FIG. 18A-18C. FIG. 18A shows a multi-tone waveform with periodic chirp. Such waveforms have been discussed above. Another waveform, shown in FIG. 18B, is a pulse that contains multiple tones that have a linear frequency modulation or chirp. FIG. 18C shows a waveform containing many short segments of multi-tone chirps. A simple version of such a waveform can be constructed from the waveform of FIG. 18B by dividing it into many segments and rearranging the order of those segments. Note that since the original linear FM is a single-value invertible (SVI) function, the rearranged modulation segments also comprise a SVI function. The segments can be arranged in many ways and the arrangements can differ from pulse to pulse. Also, the frequency modulation rate (e.g. the slope of the chirp) can be changed from one segment to the next. This variation of the frequency modulation rate also is illustrated in FIG. 18C. The temporal durations of the segments can be different. In general, segments that have higher FM rates would be shorter. Although a linear frequency modulation is illustrated, various frequency modulation functions could be used. The only constraint is that the functions have the SVI property.

Figure 19:
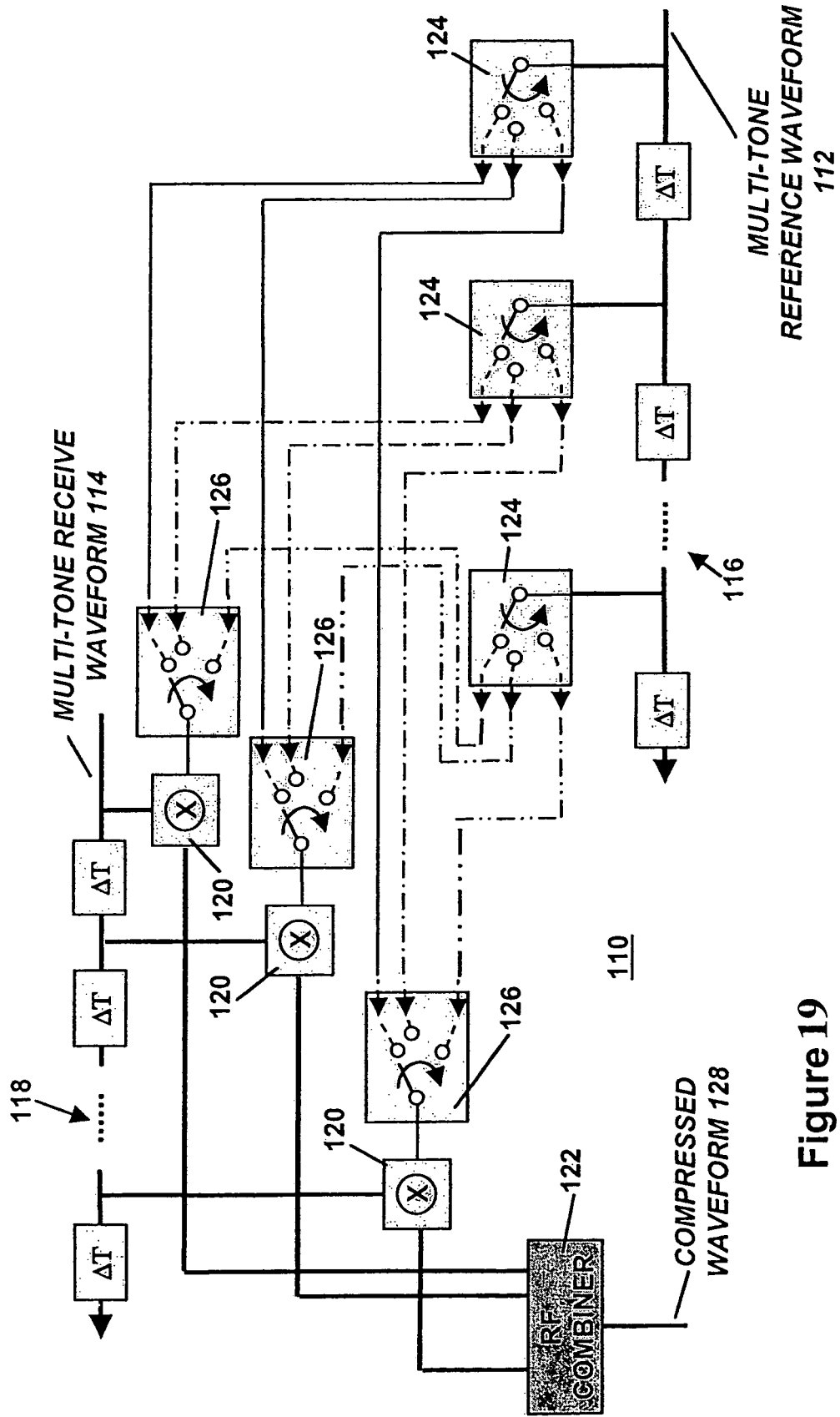
FIG. 19 is a block diagram illustrating a switched and tapped delay-line pre-processor for the frequency modulated waveform of FIG. 18C.

A Receive pre-processor 110 for the type of waveform shown in FIG. 18B is illustrated in FIG. 19. This pre-processor has two inputs. One of the inputs is the Transmit reference 112 from the generator of FIG. 2B. The other input is the Receive waveform, or the radar return signal, 114. Both the Transmit reference and the Receive waveforms could be supplied as either an electrical signal or as a RF-lightwave signal. For simplicity of illustration, the pre-processor 110 in FIG. 19 is designed for waveforms that have segments of fixed duration and whose frequency modulation rate remains the same from segment to segment. The pre-processor 110 contains two tapped delay lines 116, 118, one for the reference waveform 112 and one for the Receive waveform 114. There are as many taps in a delay line as segments in a pulse. The time delay of the delay lines 116, 118 is matched to the duration of the segments. For the Receive waveform 114, each tap feeds a multi-tone comparator 120. Also, each tap is associated with a particular segment of the corresponding Transmit waveform 112. The outputs of the comparators 120 are combined to produce the compressed multi-tone pulse 128. For the reference waveform, each tap feeds a pair of switches 124, 126, which direct that tapped segment to one of the multi-tone comparators 120. Each switch 124, 126 preferably has a single pole, N throw capability, where N is the number of segments. The function of the tapped delay line 116 and switches 124, 126 for the reference waveform 112 is to present multiple time-delayed copies of a particular segment of the reference waveform to the multi-tone comparator 120 that is associated with that segment. The effect is a sliding correlator that continually compares the Receive waveform 114 with a spatially segmented version of the Transmit reference 112. Absolute synchronization of the Receive waveform 114 with the reference waveform 112 is not necessary since the reference waveform 112 is repeated every segment interval. The range ambiguity of this pre-processor is, thus, just the range associated with the duration of a segment.

In FIG. 19, the paths interconnecting switches 124, 126 are shown either as a solid line, or as a different style of a dashed line. These styles (solid or a particular dashed style) are also used in FIG. 20 to represent different waveform segments to show the relationship between the segments and to identify in FIG. 19 the switches 124, 126 corresponding to those segments.

Figure 20:
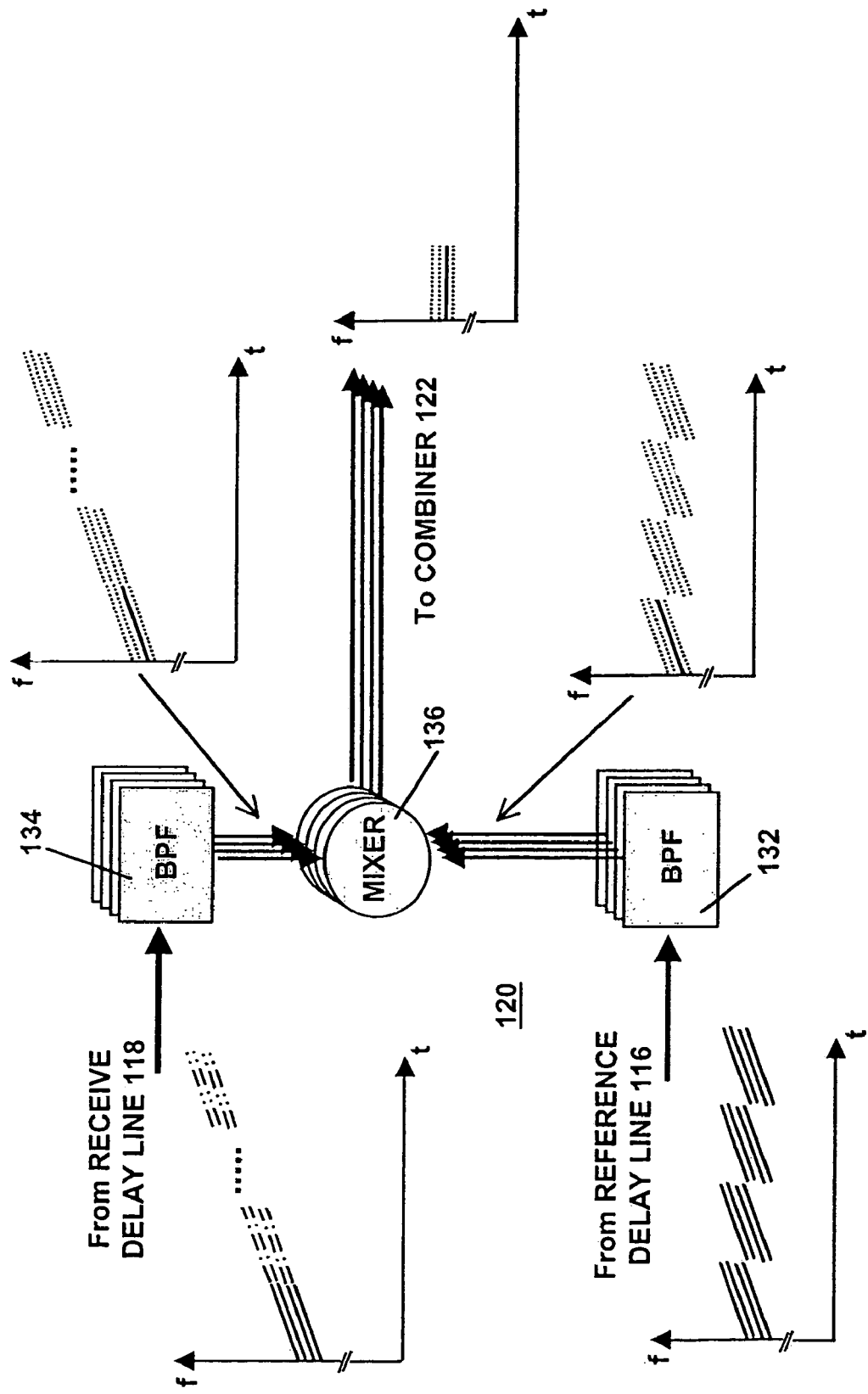
FIG. 20 is a block diagram illustrating multi-tone comparator functions for the pre-processor.

FIG. 20 depicts a multi-tone comparator 120 shown as a block in FIG. 19 and also depicts the tones (or tone placeholders) on the receive and reference delay lines 114, 112. The comparator 120 includes two sets of filters 132, 134 and a set of mixers 136. One set of filters is fed the multi-tone segments of the reference waveform 112. The other set is fed the multi-tone segments of the Receive waveform 114. Those filters separate the multiple tones into individual tones or into small groups or subsets of tones. Non-selected tones ("tone placeholders"are depicted by dashed lines (having very short dashes) on the right hand side of FIG. 20, with the selected tone being shown as a solid line.

Frequency selective multiplexers or directional filters could be used instead of the filters. Note, also, that the functions of these filters could be accomplished by sets of filters located at the inputs of the tapped delay lines, as discussed later. Each mixer 136 is associated with a given pair of filters, with one filter from each set. The mixers 136 mix or multiply the selected tones (or groups of tones) and determine their temporal overlap as well as their frequency difference. Those skilled in the art will realize that these parameters provide information on the object being illuminated by a radar signal. For example, the presence of temporal overlap and the time elapsed between the start of the Transmit pulse and the occurrence of that overlap provides an indication of the target range. Also, the frequencies of the mixer output tones can provide information on both the target range and its Doppler velocity. Further processing is used to derive this information. Processing of the various mixer output tones can be done by treating them separately, in separate processing circuits, or by first combining those tones together. Methods for this additional processing and combination are known in the art of radar processing and therefore are not explained in greater detail here.

The preferred characteristics of the filters 132, 134 and mixers 136 are discussed next. The relation between characteristics such as the filter bandwidth and center frequency and the frequency spacing of the multiple tones as well as the duration of a segment is discussed by considering the following example. Assume the frequency spacing between tones, $\Delta f$, is 50 MHz. The waveform has forty tones that span a range of 2 GHz. Assume that the frequency modulation is linear. The overall frequency change over the duration of a pulse is 1 GHz. The pulse duration is 100 psec and is separated into 40 segments of 2.5 µsec duration. Thus, for each tone, the frequency change, $\delta f$, of that tone within a segment interval is 25 MHz. It is important to keep the frequency change $\delta f$ significantly smaller than the frequency spacing $\Delta f$. This allows a set of filters to separate out the different tones of a multi-tone waveform. The filter 132, 134 passband must be wider than the frequency change δf. The number of filters or mixers in a set is determined by the total frequency span, which is the span of the multi-tone waveform combined with the maximum frequency change of a given tone. For the example, this total span is 3 GHz.

In the example, the number M of filters or mixers needed per segment is sixty, for a tone spacing of 50 MHz. Also, there are 2×N sets of filters and N sets of mixers, where N is the number of segments. A "brute-force" implementation of the present example would require 4,800 filters and 2,400 mixers. Another "brute-force" implementation separates the filtering function from the multi-tone mixing function. This implementation has M filters placed at the front of M sets of tapped delay lines to handle, separately, the Receive and reference waveform segments. The number of filters is reduced, to 2×M=120, at the expense of an increased number of tapped delay lines, from 2 to 120. Also, M-throw switches are now needed. The total number of mixers remains the same.

Figure 21:
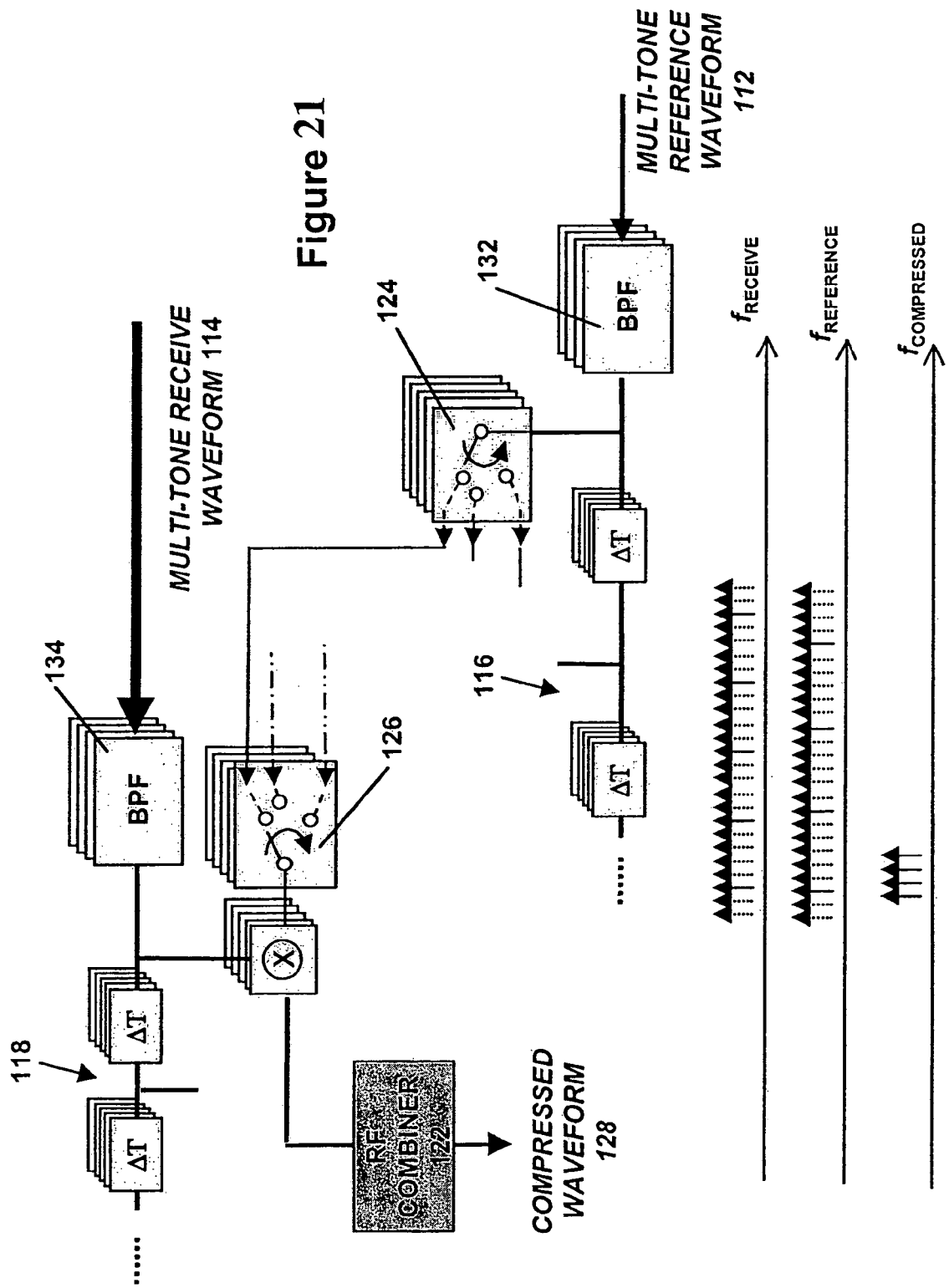
FIG. 21 illustrates a first stage of a preferred delay-line pre-processor for multi-tone generation.

It might appear that the filters 132, 134 must have a single passband. Some filters may have spectrally periodic passbands. Such filters could be implemented, for example, by resonator elements or as transversal designs. For such filters to be used, it would appear that their free spectral ranges (FSR) or spectral periods should be greater than the total frequency span of the frequency-modulated multi-tone waveform (which in this example is 2 +1 GHz). This requirement ensures that there is no folding or indeterminacy of the multiple tones. However, a preferred implementation of the disclosed Receiver pre-processor 110 makes use of filters that have a FSR that is smaller than the total frequency span. This implementation is illustrated in FIG. 21. An important feature of this particular implementation is that the FSR of the filters 134 for the Receive waveform are different than the FSR of the filters 132 for the reference waveform. Thus, the various aliasing tones are offset in frequency from each other. This permits them to be combined later in power (incoherently) rather than in amplitude (coherently). Consider an example in which the filters 134 for the Receive waveform have a FSR of 7×40=280 MHz. Also, the filters 132 for the reference waveform have a FSR of 8×40=320 MHz. In this case, mixing of the filtered signals will create multiple tones that are separated by 50 MHz. Since their FSRs are different, each mixing tone arises from a distinct pair of tones passed by the two spectrally periodic filters. A benefit of this approach is the reduction of filters and tapped delay lines. For example, the Receive waveform, is now processed by seven filters and tapped delay lines and the reference waveform is now processed by eight filters and tapped delay lines. Thus, the total number of filters and tapped delay lines has been reduced to fifteen. Also, the number of mixers needed has been reduced to 15×40=600. The trade-off for this implementation is that the output of each mixer now has approximately eight tones. The subsequent processor must distinguish between these tones (e.g. by filtering them). Such processing of a small number of tones whose frequencies are constant is within the capability of the prior art.

The pre-processor of this invention also can process a waveform, produced by periodic frequency modulation. Consider, for consistency with the above example, a waveform produced by a frequency modulation rate of 0.2 MHz and having a frequency excursion of 50 MHz. The period of this periodic chirp is 5 μsec. With the pre-processor of this example, two segments would be contained in each temporal period of the chirp. Again, the filters should have a passband width of at least 25 MHz.

The invention has been described with reference to a number of different embodiments. Those skilled in the art will realize that there are engineering tradeoffs to be made in selecting a particular embodiment (or a modification thereof) for a particular application. For example, in radar applications, those skilled in the art will realize that the frequency modulated embodiments will enjoyed improved range resolution but at the same time will experience poorer phase noise, meaning that slower moving objects are more difficult to detect.

Having described the invention in connection with embodiments therefore, modification will now certainly suggest itself to those skilled in the art. As such, the invention is not to be limited to the disclosed embodiments except as required by the appended claims.

The invention claimed is:

1. A spread spectrum waveform generator comprising:
   (a) a photonic oscillator comprising a multi-tone optical comb generator for generating a series of RF comb lines on an optical carrier;
   (b) an optical heterodyne synthesizer, the optical heterodyne synthesizer including first and second phase-locked lasers, the first laser feeding the multi-tone optical comb generator and the second laser comprising a single tone laser whose output light provides a frequency translation reference; and
   (c) a photodetector for heterodyning the frequency translation reference with the series of RF comb lines on the optical carrier generated by the photonic oscillator to generate a spread spectrum waveform, and
   wherein the photonic oscillator comprises:
      a first optical branch comprising a first optical delay element;
      a second optical branch comprising a main optical fiber having a forward direction of light propagation;
      a third optical branch, said third optical branch providing a Stokes beam to said second optical branch, said Stokes beam propagating in said main optical fiber in a direction opposite to said forward direction of light propagation; and
      a common path, said common path comprising:
         an optical portion having an optical modulator providing an optical signal to said first optical branch, said second optical branch, and said third optical branch; and
         an electrical portion having at least one photodetector coupled to said first optical branch and said second optical branch, said at least one photodetector producing an electrical signal coupled to said optical modulator.

2. The spread spectrum waveform generator of claim 1, wherein said electrical portion comprises:
   a first photodetector coupled to said first optical branch;
   a second photodetector coupled to said second optical branch;
   an electrical combiner coupled to said first photodetector and said second photodetector and producing a combined electrical output; and
   a bandpass filter receiving said combined electrical output and providing a filtered electrical signal to said optical modulator.

3. The spread spectrum waveform generator of claim 1, wherein said common path further comprises at least one element of the group of elements consisting of an electrical amplifier, an optical amplifier, an electrical phase shifter, and an optical phase shifter.

4. The spread spectrum waveform generator of claim 1, wherein said common path further comprises a variable optical coupler, said variable optical coupler having an input receiving said optical signal, and having a first adjustable output coupled to said first optical branch, a second adjustable output coupled to said second optical branch, and a third adjustable output.

5. The spread spectrum waveform generator of claim 1, wherein at least one optical branch of said first and second optical branches further comprises at least one element of the group of elements consisting of an optical amplifier and a variable optical attenuator.

6. The spread spectrum waveform generator of claim 1, wherein said first optical delay element comprises optical fiber.

7. The spread spectrum waveform generator of claim 1, wherein said third optical branch comprises an optical notch filter that reduces a component of Stokes light that is generated in said Stokes beam.

8. The spread spectrum waveform generator of claim 1, wherein said third optical branch comprises an optical notch filter that reduces the amount of power of said optical carrier coupled into said third optical branch.

9. The spread spectrum waveform generator of claim 1, wherein said Stokes beam is produced by stimulated Brillouin scattering in said main optical fiber and said main optical fiber has an input and an output and said third optical branch comprises:
  an optical amplification path, said optical amplification path having an input and an output;
  a first optical circulator, said first optical circulator coupling said optical signal to said input of said main optical fiber and coupling said Stokes beam to said input of said optical amplification path; and
  a second optical circulator, said second optical circulator coupling said output of said optical amplification path to said main optical fiber and coupling said output of said main optical fiber to said at least one photodetector.

10. The spread spectrum waveform generator of claim 9, wherein said optical amplification path comprises one or more optical amplifiers or one or more optical amplifiers and one or more variable optical attenuators.

11. The spread spectrum waveform generator of claim 1, wherein said main optical fiber has an input and an output and wherein said second optical branch further comprises an optical splitter having a first splitter output and a second splitter output, the second splitter output directing said optical signal to said input of said main optical fiber, and
  wherein said third optical branch comprises:
    an optical amplification path having an input and an output;
    an optical path producing said Stokes beam by stimulated Brillouin scattering;
    a first optical circulator having at least three ports, wherein a first port of said first optical circulator is coupled to said first splitter output and a second port of said first optical circulator coupled to said input of said optical amplification path, and a third port of said first optical circulator is coupled to said optical path producing said Stokes beam, said first optical circulator directing said optical signal to said optical path producing said Stokes beam and directing said Stokes beam to said optical amplification path; and,
    a second optical circulator, said second optical circulator coupling said output of said optical amplification path to said main optical fiber and coupling said output of said main optical fiber to said at least one photodetector.

12. The spread spectrum waveform generator of claim 11, wherein said optical path producing said Stokes beam comprises:
  a loop of optical fiber; and
  a 2×2 optical coupler having at least three ports, a first port of said 2×2 optical coupler coupled to a first end of said loop of optical fiber, a second port of said 2×2 optical coupler coupled to a second end of said loop of optical fiber, and a third port of said 2×2 optical coupler coupling said Stokes beam into and out of said loop of optical fiber.

13. The spread spectrum waveform generator of claim 12, wherein the coupling strength of said 2×2 optical coupler is adjustable.

14. The spread spectrum waveform generator of claim 11, wherein said optical path producing said Stokes beam comprises a length of optical fiber.

15. The spread spectrum waveform generator of claim 11, wherein said optical amplification path comprises one or more optical amplifiers or one or more optical amplifiers and one or more variable optical attenuators.

16. The spread spectrum waveform generator of claim 11, wherein a fraction of said optical signal is directed to said optical path producing said Stokes beam and said optical path producing said Stokes beam has a length sufficient to ensure a Stokes seed is generated.

17. The spread spectrum waveform generator of claim 11, wherein said optical path producing said Stokes beam has one or more optical amplifiers.

18. The spread spectrum waveform generator of claim 11, wherein said second optical branch further comprises an optical isolator blocking said Stokes beam from coupling into said common path.

19. The spread spectrum waveform generator of claim 11, wherein said second optical branch further comprises a third optical circulator disposed between said second splitter output and said input to said main optical fiber.

20. A method of generating a spread spectrum waveform, the method comprising the steps of:
  (a) generating a multi-tone optical comb as a series of RF comb lines on an optical carrier;
  (b) generating a single tone frequency translation reference; and
  (c) optically combining the optical comb with the frequency translation reference to generate a lightwave waveform suitable for subsequent heterodyning, and
  wherein the step of generating a multi-tone optical comb comprises:
    modulating an optical signal from a laser with an optical modulator to provide a modulated optical signal;
    delaying said modulated optical signal in a first optical branch to provide a first delayed optical signal;
    propagating said modulated optical signal in a forward direction in a second optical branch to provide a second delayed optical signal;
    generating Stokes light from said modulated optical signal;
    injecting said Stokes light into said second optical branch so that said Stokes light propagates in a reverse direction to said modulated optical signal in said second optical branch, wherein said Stokes light acts as a seed for stimulated Brillouin scattering in said second optical branch;
    photodetecting said first delayed optical signal and said second delayed optical signal to produce an electrical signal; and
    controlling said optical modulator with said electrical signal.

21. The method of claim 20, wherein said first optical branch comprises optical fiber and said second optical branch comprises optical fiber.

22. The method of claim 20, wherein said method further comprises at least one step of the group of steps consisting of a step of amplifying said electrical signal, a step of band pass filtering the electrical signal, and a step of phase shifting the electrical signal.

23. The method of claim 20, further comprising the steps of
directing said modulated optical signal to said first optical branch from a first output of a variable optical coupler;
directing said modulated optical signal to said second optical branch from a second output of said variable optical coupler;
providing said multi-tone optical comb from a third output of said variable optical coupler; and
controlling a output power level of at least one output of said first output, said second output, and said third output.

24. The method of claim 20, wherein at least one optical branch of the first and second optical branches comprises at least one element of the group of elements consisting of an optical amplifier and a variable optical attenuator.

25. The method of claim 20, wherein said second optical branch comprises a main optical fiber and said step of generating Stokes light comprises the steps of:
directing said modulated optical signal into said main optical fiber, wherein said Stokes light is produced by stimulated Brillouin scattering in said main optical fiber;
directing said reverse propagating Stokes light from said second optical branch to an optical amplification path with an optical circulator; and
amplifying said Stokes light.

26. The method of claim 25, further comprising the step of variably attenuating said Stokes light.

27. The method of claim 25, further comprising the step of filtering a component of Stokes light generated by said reverse propagating Stokes light.

28. The method of claim 20, wherein said step of generating Stokes light comprises the steps of:
directing said modulated optical signal to a third optical branch, wherein said Stokes light is produced by stimulated Brillouin scattering in said third optical branch; and
coupling said Stokes light out of said third optical branch.

29. The method of claim 28, further comprising the step of amplifying said Stokes light prior to injecting said Stokes light into said second optical branch.

30. The method of claim 28, wherein said third optical branch comprises a recirculating ring.

31. The method of claim 28, wherein said third optical branch comprises an optical fiber.

32. The method of claim 28, further comprising filtering said modulated optical signal to reduce the amount of power of said modulated optical signal coupled into said third optical branch.

33. A multi-tone photonic oscillator comprising:
a laser producing an optical carrier wave;
a first optical branch comprising a first optical delay element;
a second optical branch comprising a main optical fiber having a forward direction of light propagation;
a third optical branch, said third optical branch providing a Stokes beam to said second optical branch, said Stokes beam propagating in said main optical fiber in a direction opposite to said forward direction of light propagation; and
a common path, said common path comprising:
an optical portion having an optical modulator receiving said optical carrier wave and providing an optical signal to said first optical branch, said second optical branch, and said third optical branch; and,
an electrical portion having at least one photodetector coupled to said first optical branch and said second optical branch, said at least one photodetector producing an electrical signal coupled to said optical modulator.

34. The multi-tone photonic oscillator of claim 33, wherein said electrical portion comprises:
a first photodetector coupled to said first optical branch;
a second photodetector coupled to said second optical branch;
an electrical combiner coupled to said first photodetector and said second photodetector and producing a combined electrical output; and
a bandpass filter receiving said combined electrical output and providing a filtered electrical signal to said optical modulator.

35. The multi-tone photonic oscillator of claim 33, wherein said common path further comprises at least one element of the group of elements consisting of an electrical amplifier, an optical amplifier, an electrical phase shifter, and an optical phase shifter.

36. The multi-tone photonic oscillator of claim 33, wherein said common path further comprises a variable optical coupler, said variable optical coupler having an input receiving said optical signal, and having a first adjustable output coupled to said first optical branch, a second adjustable output coupled to said second optical branch, and a third adjustable output.

37. The multi-tone photonic oscillator of claim 33, wherein at least one optical branch of said first and second optical branches further comprises at least one element of the group of elements consisting of an optical amplifier and a variable optical attenuator.

38. The multi-tone photonic oscillator of claim 33, wherein said first optical delay element comprises optical fiber.

39. The multi-tone photonic oscillator of claim 33, wherein said third optical branch comprises an optical notch filter that reduces a component of Stokes light that is generated by said Stokes beam.

40. The multi-tone photonic oscillator of claim 33, wherein said third optical branch comprises an optical notch filter that reduces the amount of power of said optical carrier coupled into said third optical branch.

41. The multi-tone photonic oscillator of claim 33, wherein said Stokes beam is produced by stimulated Brillouin scattering in said main optical fiber and said main optical fiber has an input and an output and said third optical branch comprises:
an optical amplification path, said optical amplification path having an input and an output;
a first optical circulator, said first optical circulator coupling said optical signal to said input of said main optical fiber and coupling said Stokes beam to said input of said optical amplification path; and
a second optical circulator, said second optical circulator coupling said output of said optical amplification path to said main optical fiber and coupling said output of said main optical fiber to said at least one photodetector.

42. The multi-tone photonic oscillator of claim 41, wherein said optical amplification path comprises one or more optical amplifiers or one or more optical amplifiers and one or more variable optical attenuators.

43. The multi-tone photonic oscillator of claim 33, wherein said main optical fiber has an input and an output and wherein said second optical branch further comprises an optical splitter having a first splitter output and a second splitter output, the second splitter output directing said optical signal to said input of said main optical fiber, and wherein said third optical branch comprises:

an optical amplification path having an input and an output;

an optical path producing said Stokes beam by stimulated Brillouin scattering;

a first optical circulator having at least three ports, wherein a first port of said first optical circulator is coupled to said first splitter output and a second port of said first optical circulator coupled to said input of said optical amplification path, and a third port of said first optical circulator is coupled to said optical path producing said Stokes beam, said first optical circulator directing said optical signal to said optical path producing said Stokes beam and directing said Stokes beam to said optical amplification path; and, a second optical circulator, said second optical circulator coupling said output of said optical amplification path to said main optical fiber and coupling said output of said main optical fiber to said at least one photodetector.

44. The multi-tone photonic oscillator of claim 43, wherein said optical path producing said Stokes beam comprises:

a loop of optical fiber; and a 2×2 optical coupler having at least three ports, a first port of said 2×2 optical coupler coupled to a first end of said loop of optical fiber, a second port of said 2×2 optical coupler coupled to a second end of said loop of optical fiber, and a third port of said 2×2 optical coupler coupling said Stokes beam into and out of said loop of optical fiber.

45. The multi-tone photonic oscillator of claim 43, wherein said optical path producing said Stokes beam comprises a length of optical fiber.

46. The multi-tone photonic oscillator of claim 43, wherein said optical amplification path comprises one or more optical amplifiers or one or more optical amplifiers and one or more variable optical attenuators.

47. The multi-tone photonic oscillator of claim 43, wherein a fraction of said optical signal is directed to said optical path producing said Stokes beam and said optical path producing said Stokes beam has a length sufficient to ensure a Stokes seed of sufficient power is generated.

48. The multi-tone photonic oscillator of claim 43, wherein said optical path producing said Stokes beam has one or more optical amplifiers.

49. The multi-tone photonic oscillator of claim 44, wherein the coupling strength of said 2×2 optical coupler is adjustable.

50. The multi-tone photonic oscillator of claim 43, wherein said second optical branch further comprises an optical isolator blocking said Stokes beam from coupling into said common path.

51. The multi-tone photonic oscillator of claim 43, wherein said second optical branch further comprises a third optical circulator disposed between said second splitter output and said input to said main optical fiber.

52. A method of generating a multi-tone optical comb, the method comprising the steps of:

modulating an optical signal from a laser with an optical modulator to provide a modulated optical signal;

delaying said modulated optical signal in a first optical branch to provide a first delayed optical signal;

propagating said modulated optical signal in a forward direction in a second optical branch to provide a second delayed optical signal;

generating Stokes light from said modulated optical signal;

injecting said Stokes light into said second optical branch so that said Stokes light propagates in a reverse direction to said modulated optical signal in said second optical branch, wherein said Stokes light acts as a seed for stimulated Brillouin scattering in said second optical branch;

photodetecting said first delayed optical signal and said second delayed optical signal to produce an electrical signal; and controlling said optical modulator with said electrical signal.

53. The method of claim 52, wherein said first optical branch comprises optical fiber and said second optical branch comprises optical fiber.

54. The method of claim 52, wherein said method further comprises at least one step of the group of steps consisting of a step of amplifying said electrical signal, a step of band pass filtering the electrical signal, and a step of phase shifting the electrical signal.

55. The method of claim 52, further comprising the steps of directing said modulated optical signal to said first optical branch from a first output of a variable optical coupler;

directing said modulated optical signal to said second optical branch from a second output of said variable optical coupler;

providing said multi-tone optical comb from a third output of said variable optical coupler; and controlling a output power level of at least one output of said first output, said second output, and said third output.

56. The method of claim 52, wherein at least one optical branch of the first and second optical branches comprises at least one element of the group of elements consisting of an optical amplifier and a variable optical attenuator.

57. The method of claim 52, wherein said second optical branch comprises a main optical fiber and said step of generating Stokes light comprises the steps of:

directing said modulated optical signal into said main optical fiber, wherein said Stokes light is produced by stimulated Brillouin scattering in said main optical fiber;

directing said reverse propagating Stokes light from said second optical branch to an optical amplification path with an optical circulator; and amplifying said Stokes light.

58. The method of claim 57, further comprising the step of variably attenuating said Stokes light.

59. The method of claim 57, further comprising the step of filtering a component of Stokes light generated by said reverse propagating Stokes light.

60. The method of claim 52, wherein said step of generating Stokes light comprises the steps of:

directing said modulated optical signal to a third optical branch, wherein said Stokes light is produced by stimulated Brillouin scattering in said third optical branch; and coupling said Stokes light out of said third optical branch.

61. The method of claim 60, further comprising the step of amplifying said Stokes light prior to injecting said Stokes light into said second optical branch.

62. The method of claim 60, wherein said third optical branch comprises a recirculating ring.

63. The method of claim 60, wherein said third optical branch comprises an optical fiber.

64. The method of claim 60, further comprising filtering said modulated optical signal to reduce the amount of power of said modulated optical signal coupled into said third optical branch.

* * * * *